(12) United States Patent
Suga et al.

(10) Patent No.: US 10,166,749 B2
(45) Date of Patent: Jan. 1, 2019

(54) BONDING-SUBSTRATE FABRICATION METHOD, BONDING SUBSTRATE, SUBSTRATE BONDING METHOD, BONDING-SUBSTRATE FABRICATION APPARATUS, AND SUBSTRATE ASSEMBLY

(75) Inventors: Tadatomo Suga, Tokyo (JP); Akira Yamauchi, Kyoto (JP); Ryuichi Kondou, Tokyo (JP); Yoshiie Matsumoto, Tokyo (JP)

(73) Assignees: LAN TECHNICAL SERVICE CO., LTD., Tokyo (JP); TADATOMO SUGA, Tokyo (JP)

( * ) Notice: Subject to any disclaimer, the term of this patent is extended or adjusted under 35 U.S.C. 154(b) by 192 days.

(21) Appl. No.: 13/982,686

(22) PCT Filed: Jan. 30, 2012

(86) PCT No.: PCT/JP2012/051936
§ 371 (c)(1),
(2), (4) Date: Oct. 17, 2013

(87) PCT Pub. No.: WO2012/105474
PCT Pub. Date: Aug. 9, 2012

(65) Prior Publication Data
US 2014/0037945 A1 Feb. 6, 2014

(30) Foreign Application Priority Data
Jan. 31, 2011 (JP) .................. 2011-019060

(51) Int. Cl.
*H01L 21/20* (2006.01)
*B32B 38/08* (2006.01)
(Continued)

(52) U.S. Cl.
CPC ............. *B32B 38/08* (2013.01); *B23K 1/20* (2013.01); *B23K 20/24* (2013.01); *B32B 7/04* (2013.01);
(Continued)

(58) Field of Classification Search
CPC ............. H01L 21/187; H01L 21/2007; H01L 21/76251–21/76259; H01L 21/02631;
(Continued)

(56) References Cited

U.S. PATENT DOCUMENTS 4,652,357 A * 3/1987 Colligon ............... C23C 14/22
204/192.11
5,650,378 A * 7/1997 Iijima ................ C23C 14/083
204/192.11
(Continued)

FOREIGN PATENT DOCUMENTS

CN 101454113 A 6/2009
EP 2207195 A1 7/2010
(Continued)

OTHER PUBLICATIONS

Takagi et al., 'Wafer-scale spontaneous bonding of silicon wafers by argon-beam surface activation at room temperature,' 2003 Sensors and Actuators A, vol. 105, pp. 98-102.*
(Continued)

*Primary Examiner* — Bryan Junge
(74) *Attorney, Agent, or Firm* — Pearne & Gordon LLP

(57) ABSTRACT

[Problem] To provide a substrate bonding technique having a wide range of application. [Solution] A silicon thin film is formed on a bonding surface, and the interface with the substrate is surface-treated using energetic particles/metal particles.

13 Claims, 17 Drawing Sheets

(51) Int. Cl.
  *B23K 1/20* (2006.01)
  *B23K 20/24* (2006.01)
  *H01L 21/67* (2006.01)
  *H01L 21/762* (2006.01)
  *H01L 21/302* (2006.01)
  *H01L 21/02* (2006.01)
  *H01L 23/525* (2006.01)
  *B32B 7/04* (2006.01)
  *H01J 37/317* (2006.01)
  *B23K 101/36* (2006.01)
  *H01L 23/14* (2006.01)

(52) U.S. Cl.
  CPC ...... *H01J 37/317* (2013.01); *H01L 21/02046* (2013.01); *H01L 21/2007* (2013.01); *H01L 21/302* (2013.01); *H01L 21/67092* (2013.01); *H01L 21/67115* (2013.01); *H01L 21/76251* (2013.01); *H01L 23/5252* (2013.01); *B23K 2201/36* (2013.01); *H01J 2237/08* (2013.01); *H01J 2237/202* (2013.01); *H01J 2237/3165* (2013.01); *H01L 23/147* (2013.01); *H01L 2924/0002* (2013.01); *Y10T 428/265* (2015.01); *Y10T 428/31678* (2015.04)

(58) Field of Classification Search
  CPC ................ H01L 21/203; H01L 21/2033; H01J 37/32–37/36
  See application file for complete search history.

(56) References Cited

U.S. PATENT DOCUMENTS

| | | | | |
|---|---|---|---|---|
| 6,022,458 | A * | 2/2000 | Ichikawa | C30B 23/066 204/192.23 |
| 2004/0226162 | A1 | 11/2004 | Miura et al. | |
| 2007/0072391 | A1 | 3/2007 | Pocas | |
| 2007/0110917 | A1 * | 5/2007 | Okada | H01L 21/67092 427/532 |
| 2007/0128825 | A1 | 6/2007 | Suga et al. | |
| 2007/0173037 | A1 * | 7/2007 | Nastasi | H01L 21/6835 438/475 |
| 2008/0303112 | A1 * | 12/2008 | Uya | H01L 27/14643 257/438 |
| 2010/0092786 | A1 | 4/2010 | Utsumi et al. | |
| 2010/0000663 | A1 | 6/2010 | Goto et al. | |

FOREIGN PATENT DOCUMENTS

| | | |
|---|---|---|
| EP | 2248625 A1 | 11/2011 |
| JP | 6-196673 A | 7/1994 |
| JP | 6-99317 A | 4/1997 |
| JP | 10-92702 A | 4/1998 |
| JP | 2004-337927 A | 12/2004 |
| JP | 2004-343359 A | 12/2004 |
| JP | 2007-535133 A | 11/2007 |
| JP | 2007-324195 A | 12/2007 |
| JP | 2008-62267 A | 3/2008 |
| JP | 2008-207221 A | 3/2008 |
| JP | 2009-010263 A | 1/2009 |
| JP | 2010-46696 A | 3/2010 |
| JP | 2010-89514 A | 4/2010 |

OTHER PUBLICATIONS

Extended European Search Report for Application No. 12741936.4 dated Feb. 13, 2015.
International Search Report for Application No. PCT/JP2012/051936 dated Feb. 21, 2012.

* cited by examiner

[FIG. 1]
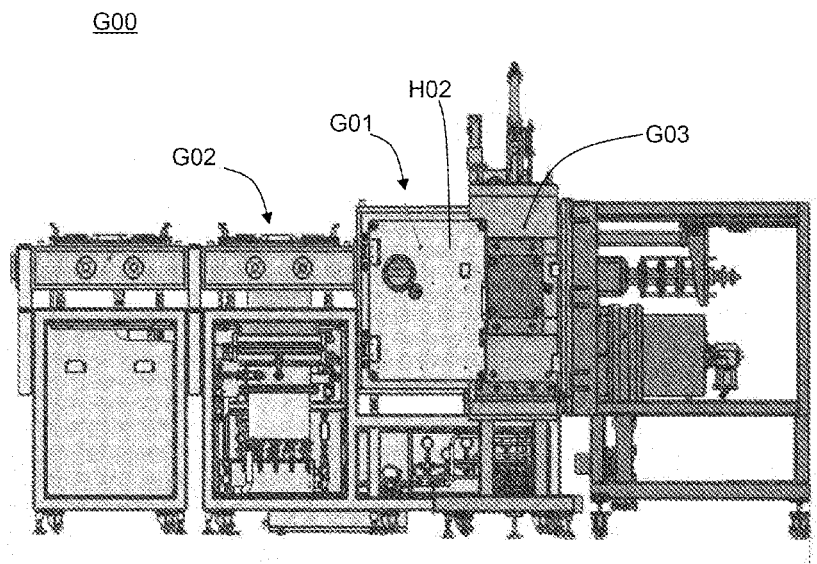
[FIG. 2]
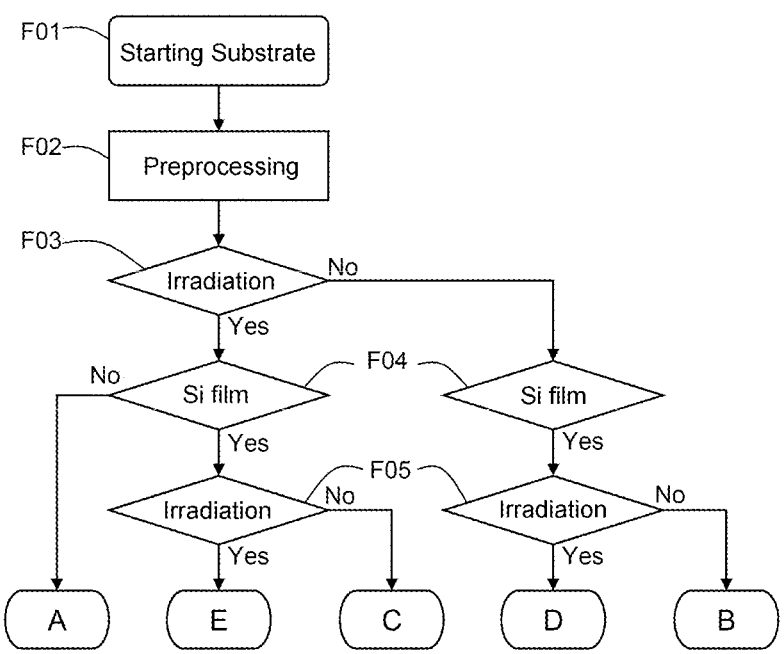

[FIG. 3]
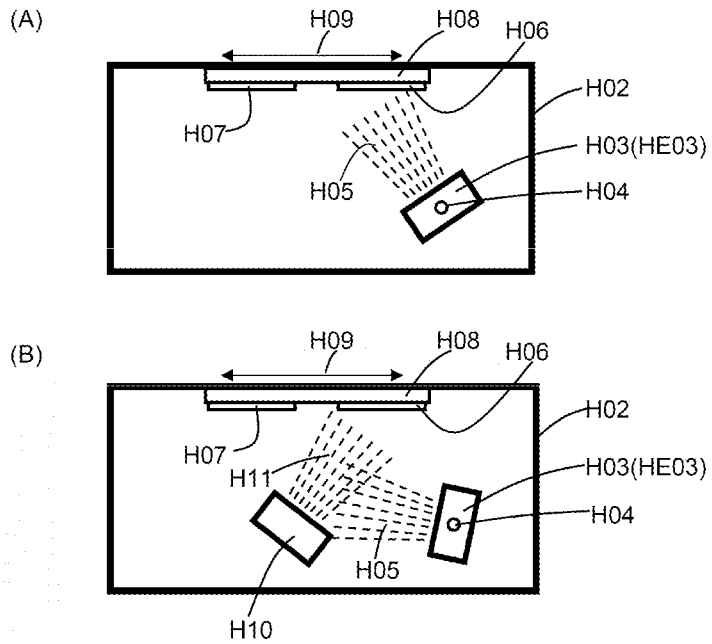
[FIG. 4]
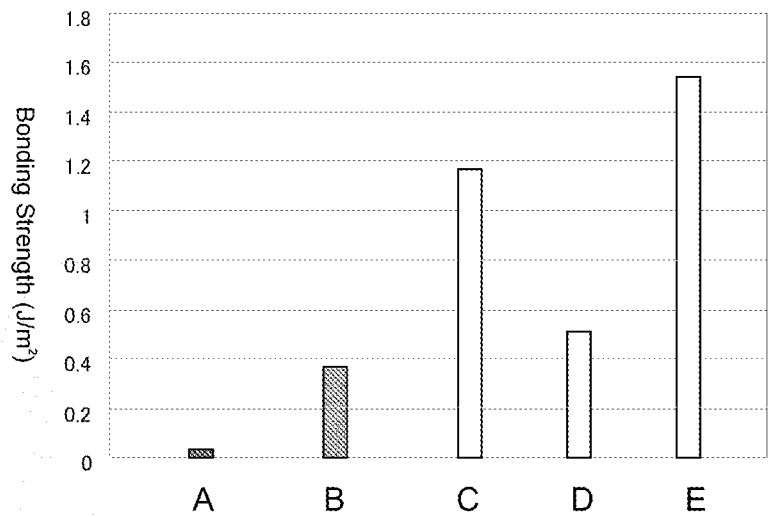

[FIG. 5]
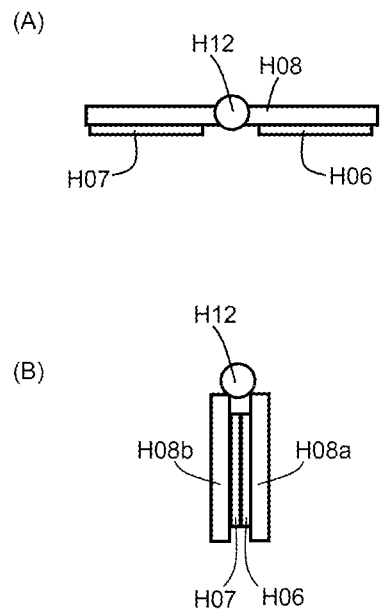
[FIG. 6]
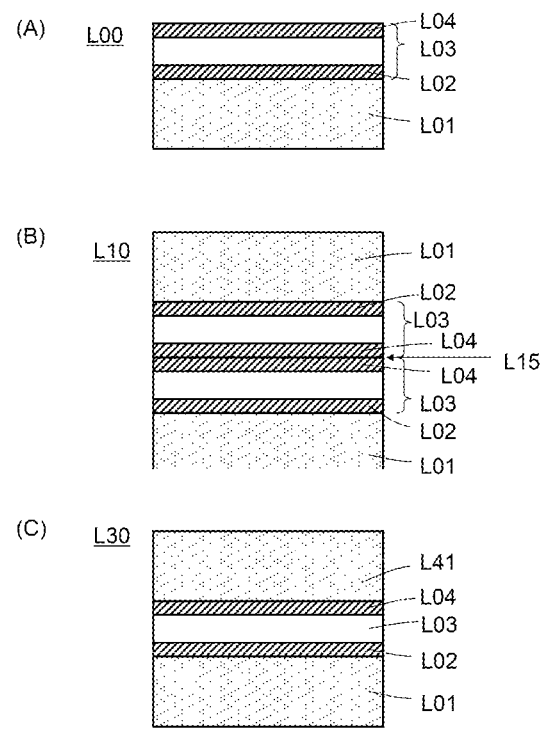

[FIG. 7]
(A)
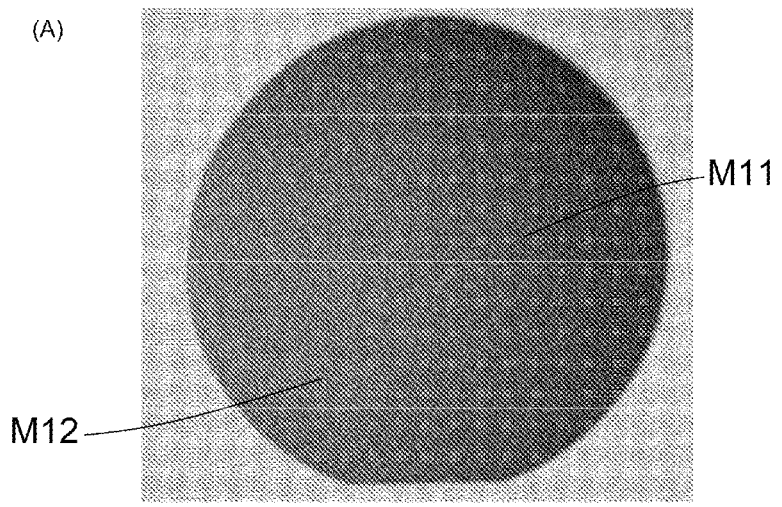
M11
M12
(B)
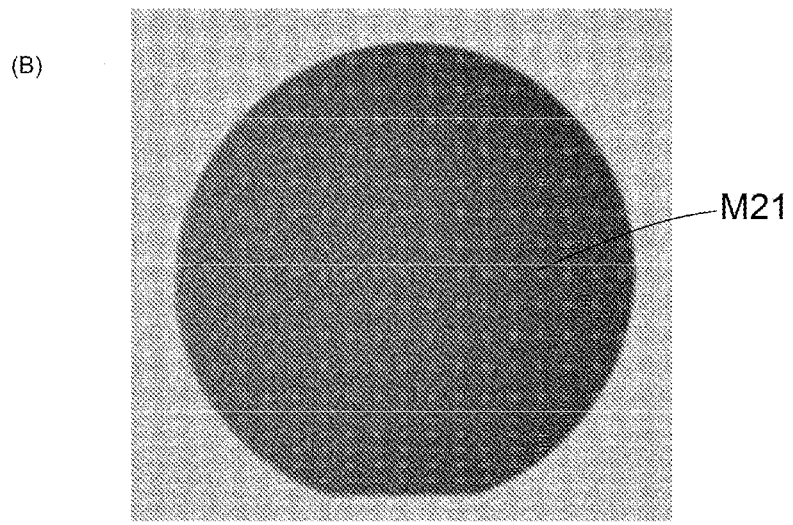
M21

[FIG. 8]
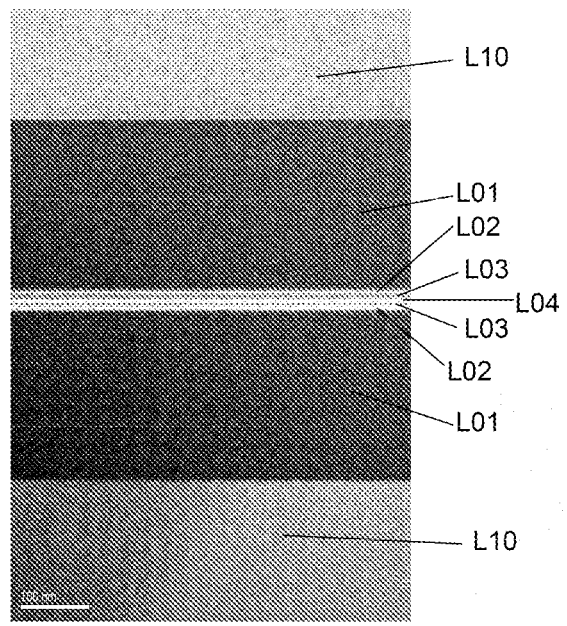
[FIG. 9]
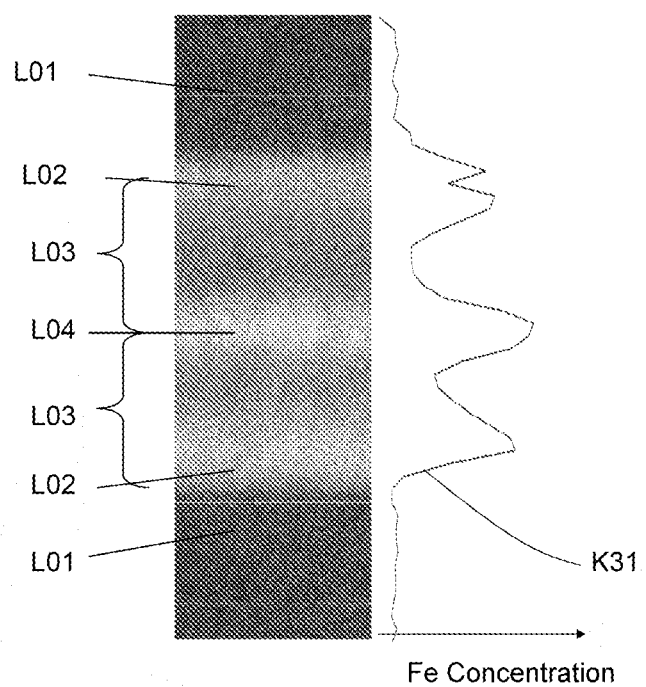
Fe Concentration

[FIG. 10]
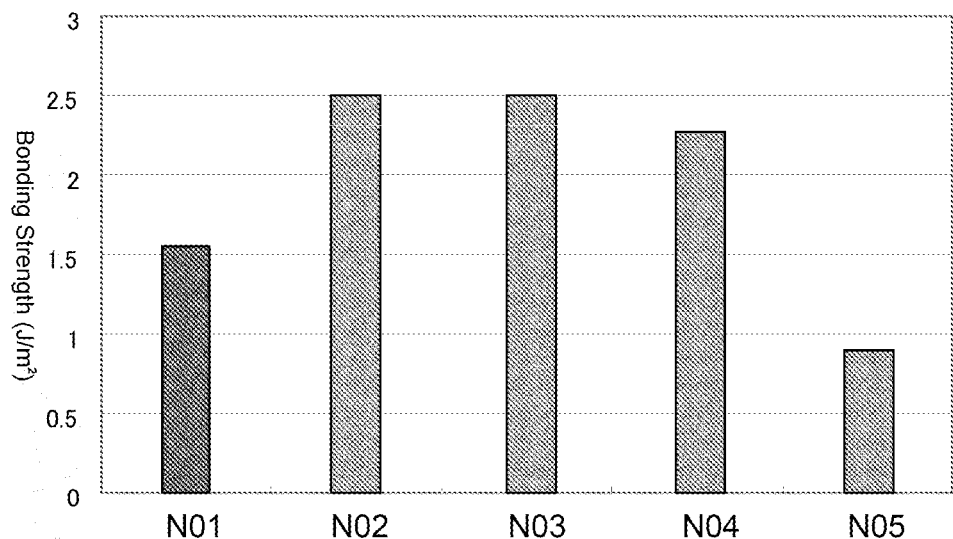
[FIG. 11]
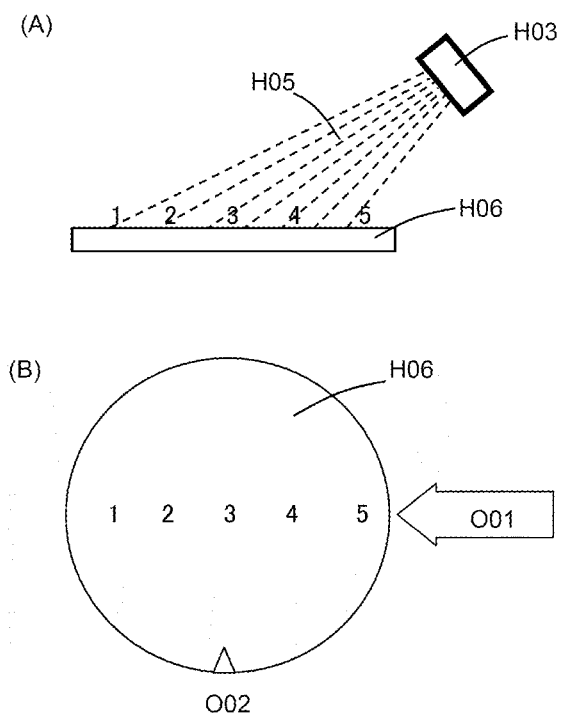

[FIG. 12]
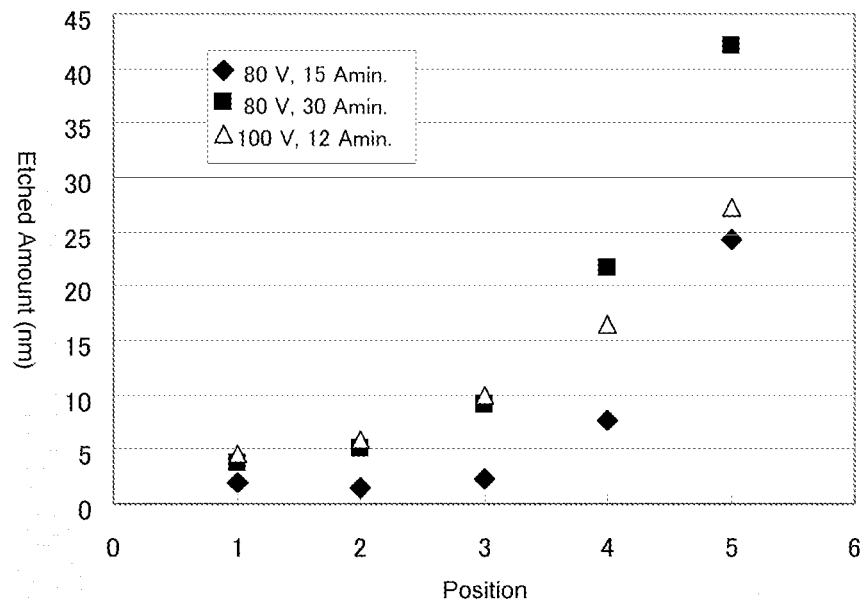
[FIG. 13]
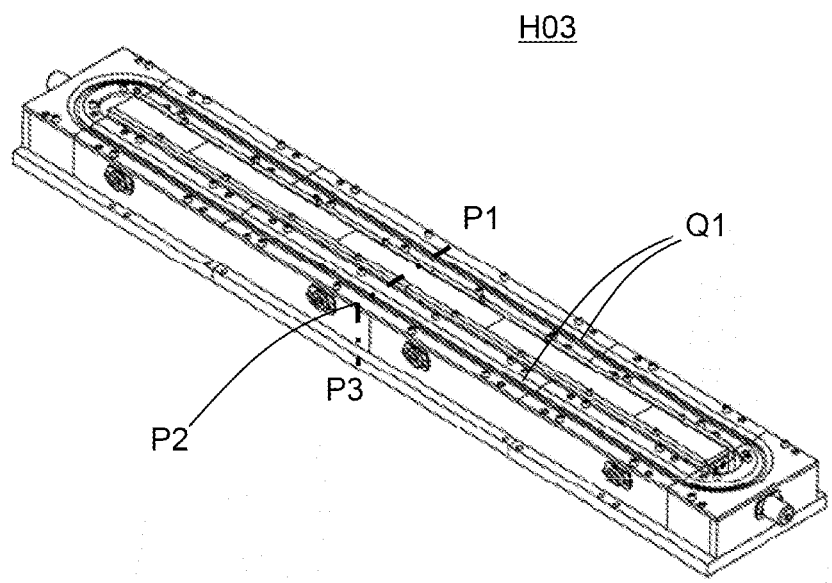

[FIG. 14]
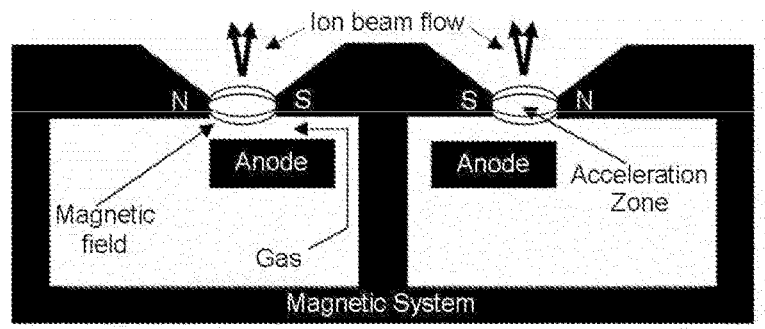
[FIG. 15]
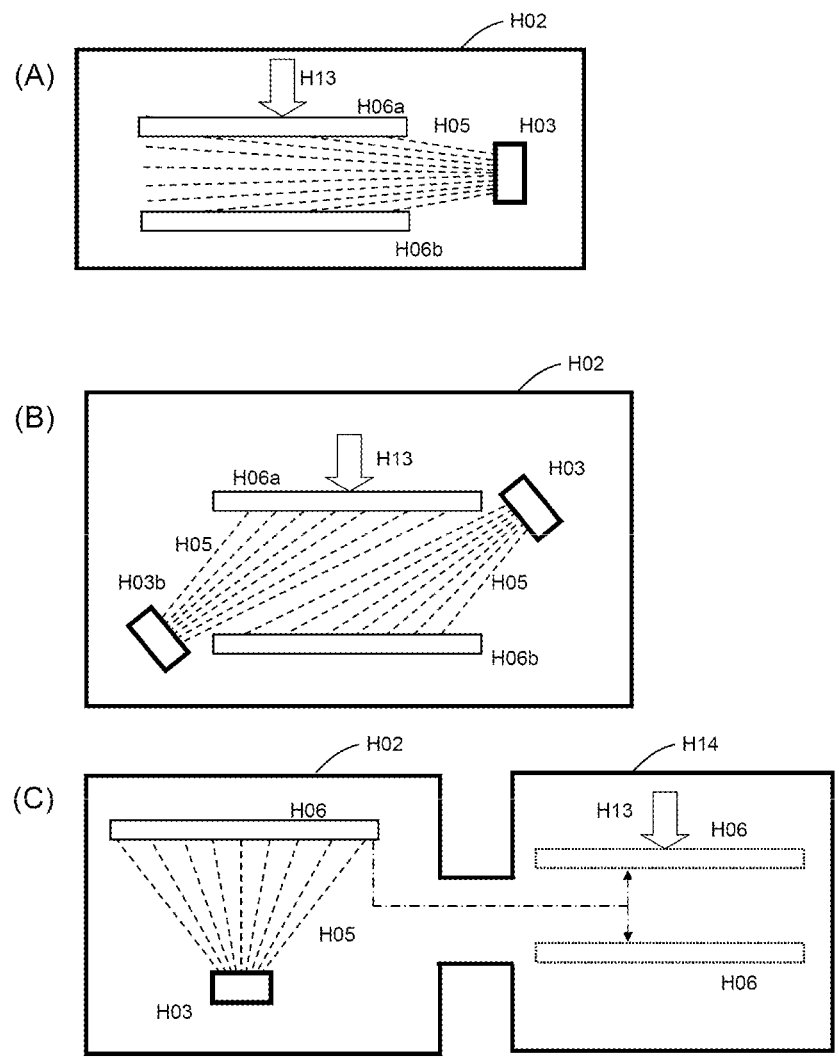

[FIG. 16]
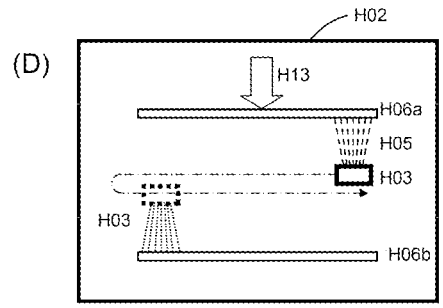
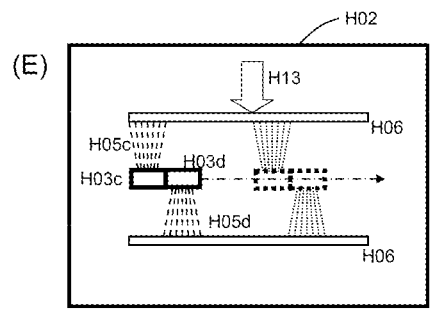
[FIG. 17]
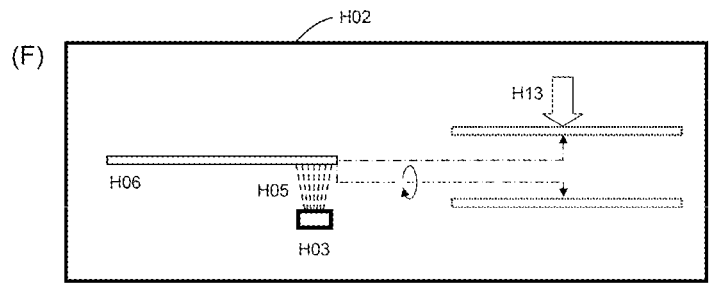
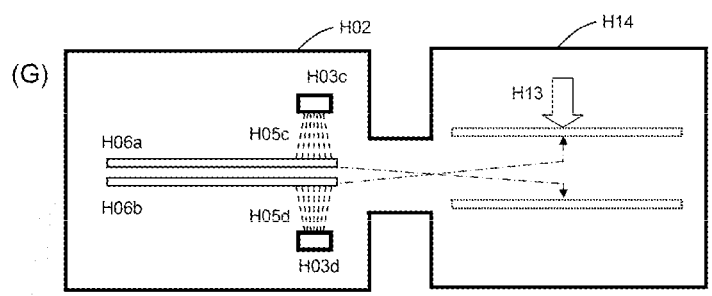

[FIG. 18]
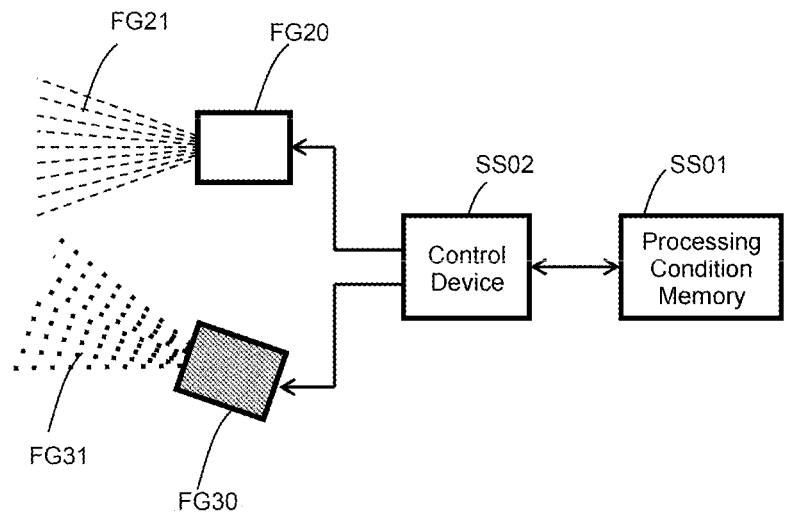
[FIG. 19]
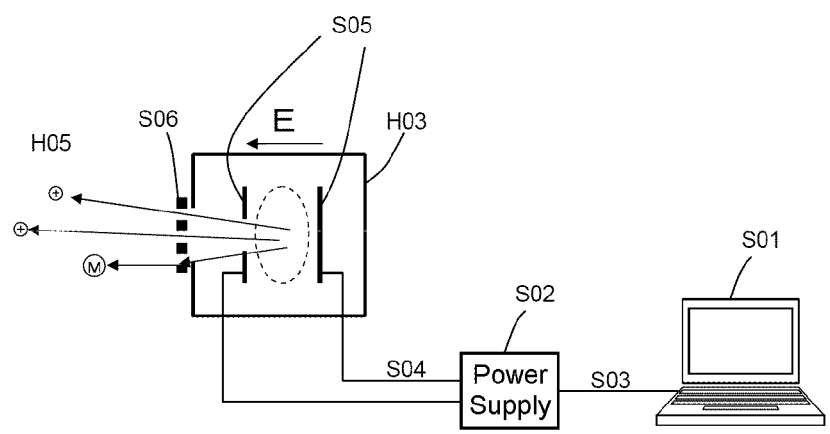

[FIG. 20]
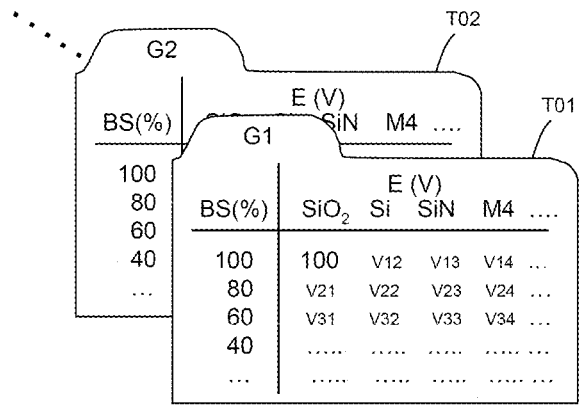
[FIG. 21]
(A)
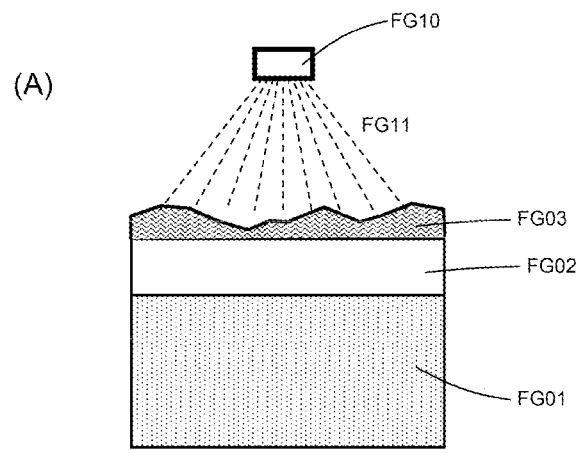
(B)
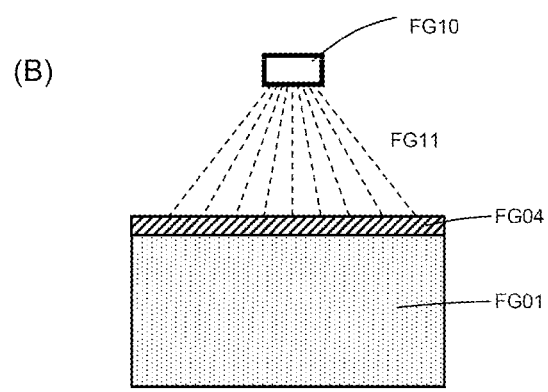

[FIG. 22]
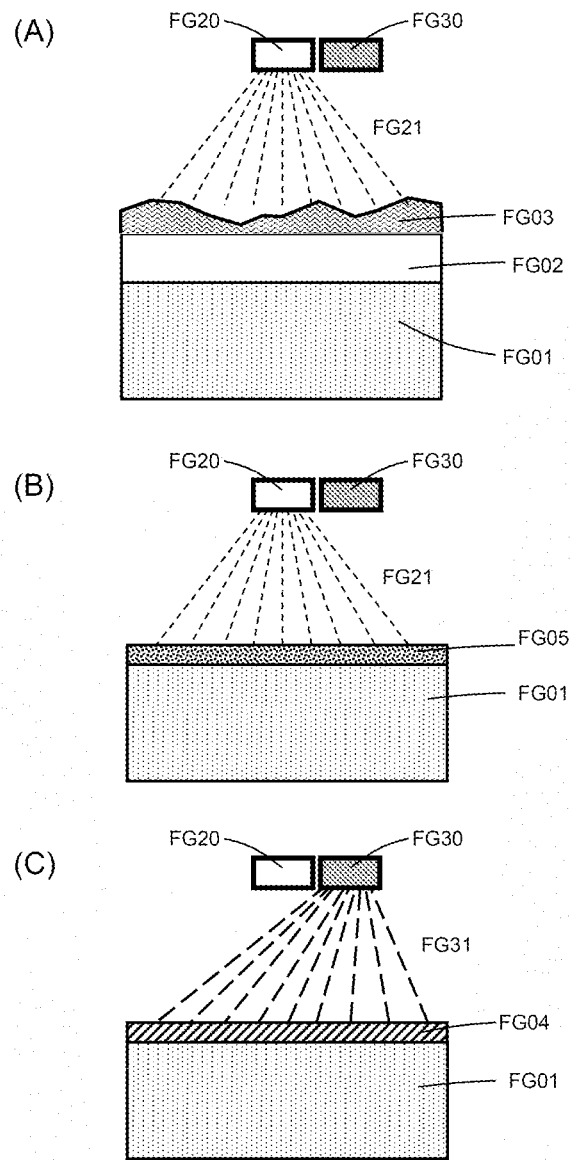
[FIG. 23]
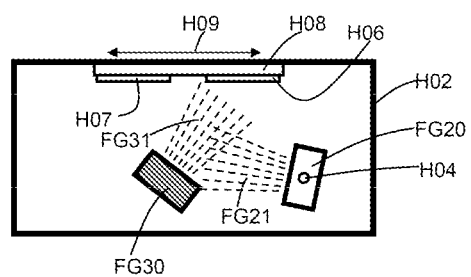

[FIG. 24]
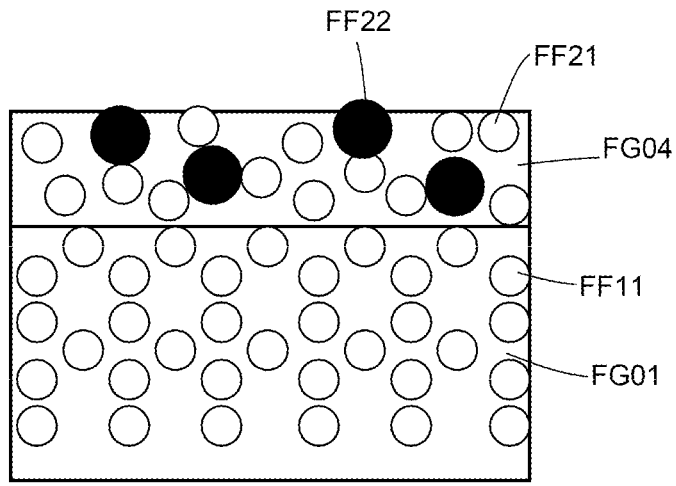
[FIG. 25]
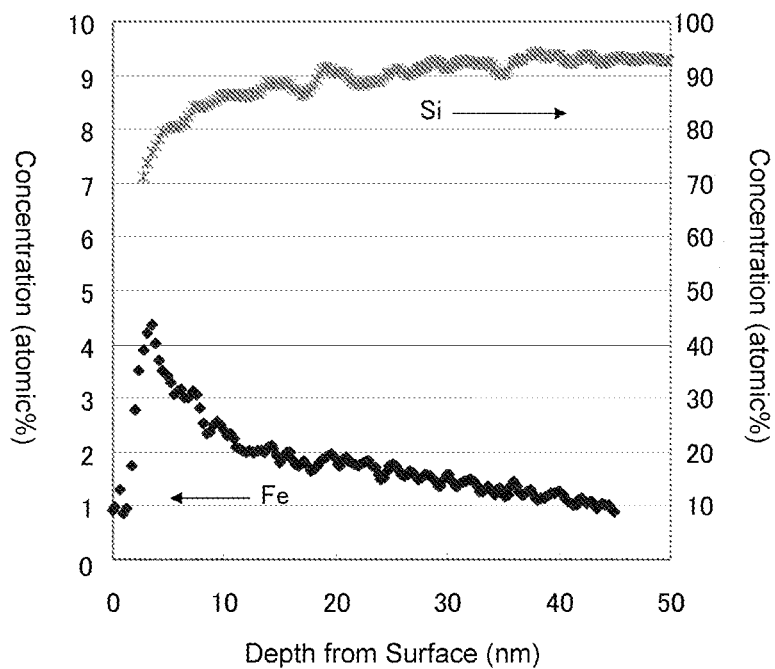

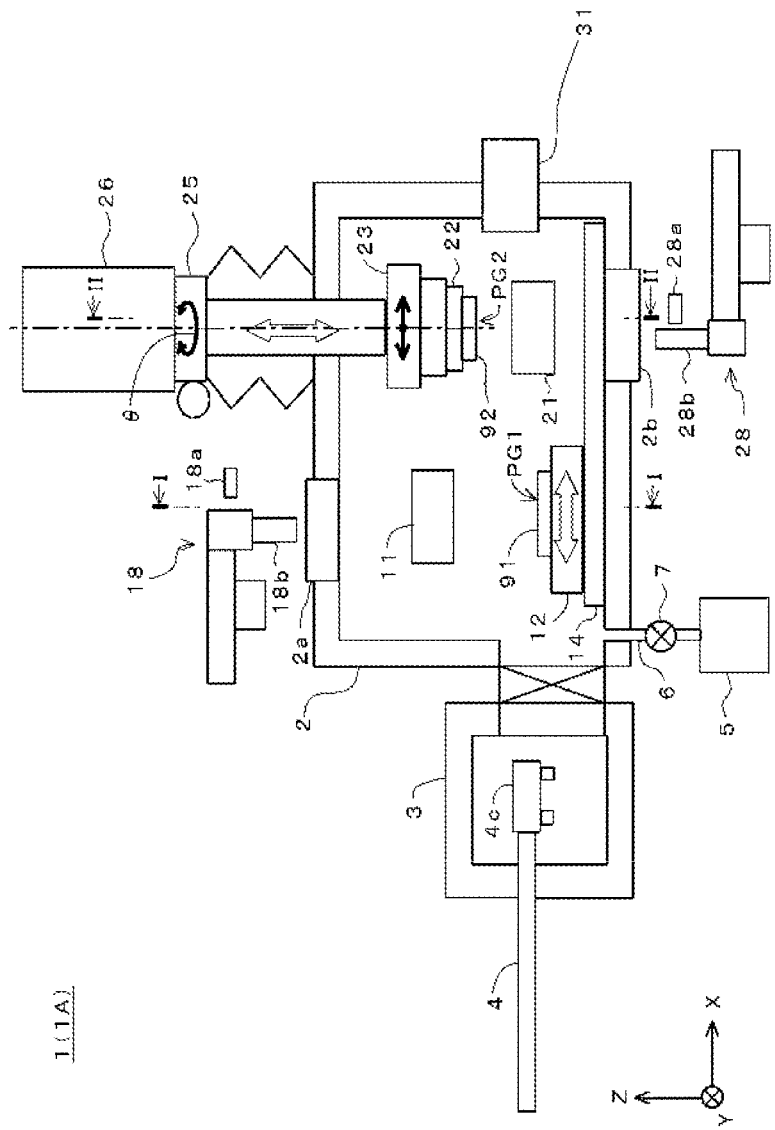
[FIG. 26]

[FIG. 27]
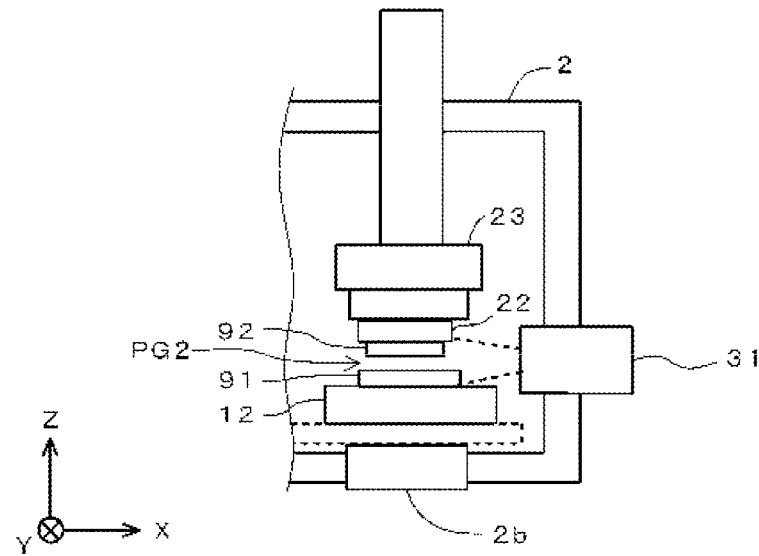
[FIG. 28]
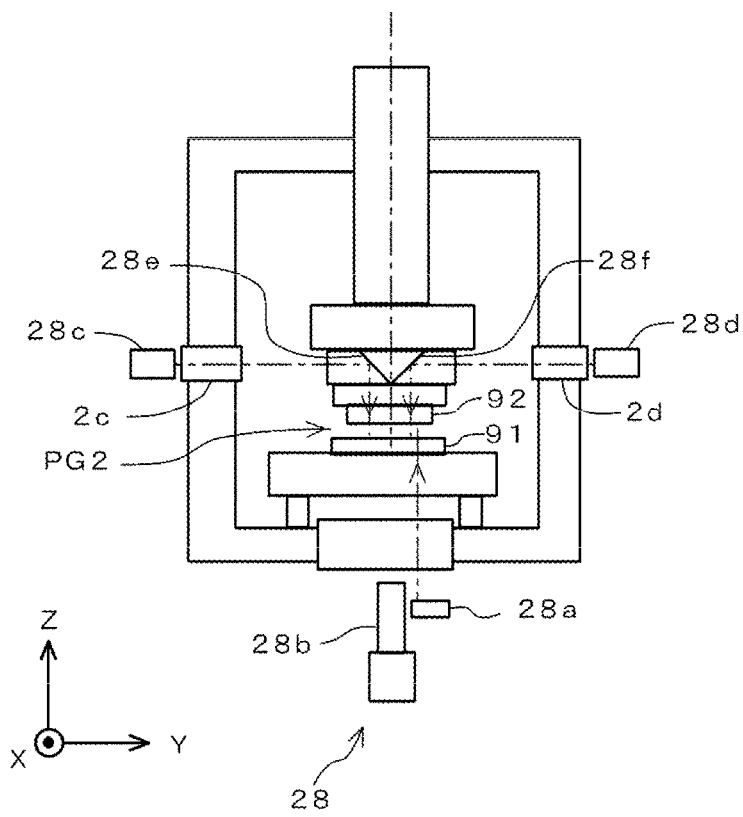

[FIG. 29]
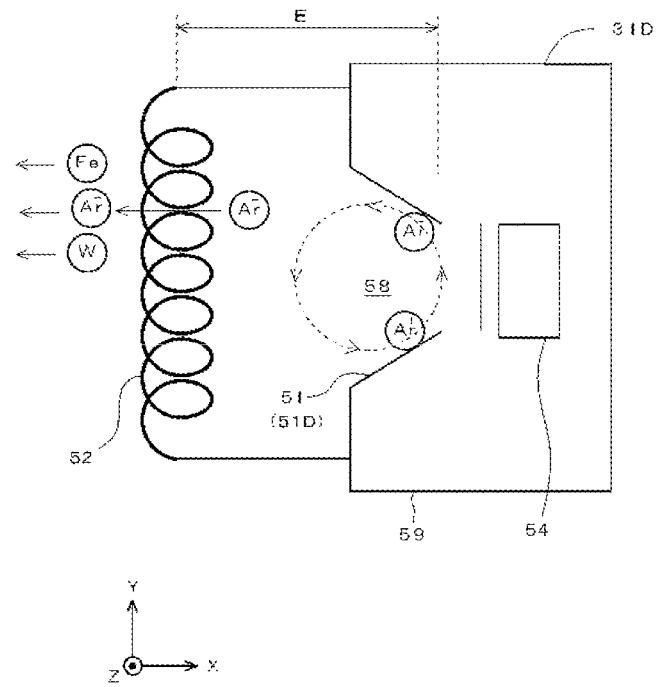
[FIG. 30]
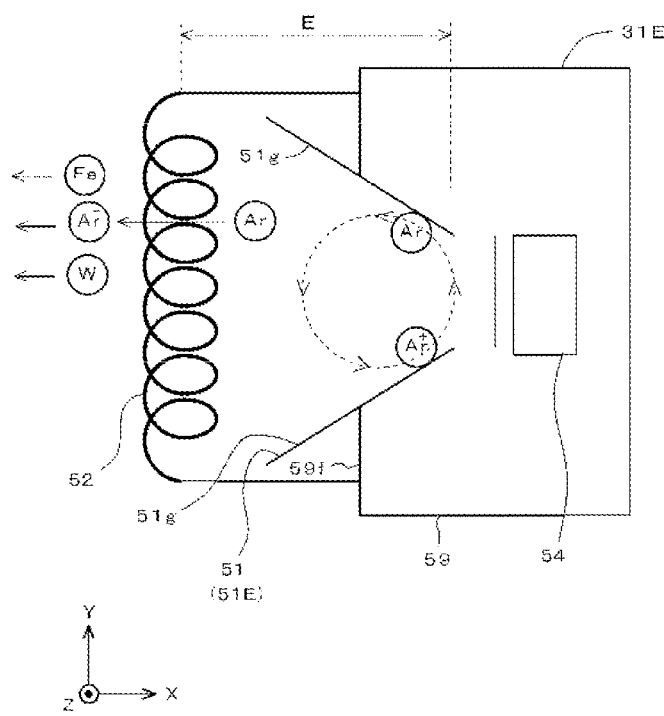

[FIG. 31]
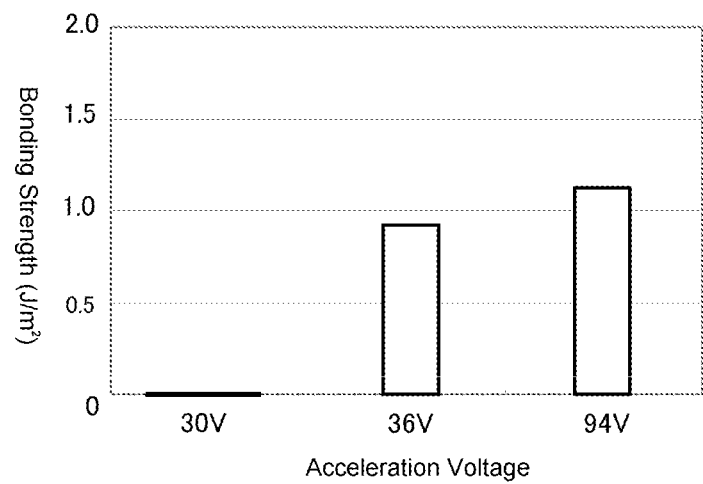
[FIG. 32]
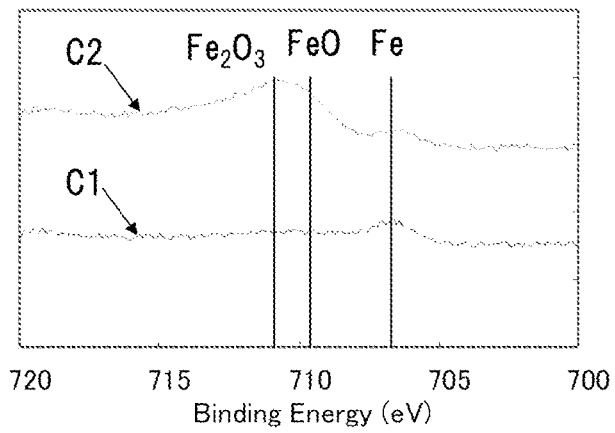

BONDING-SUBSTRATE FABRICATION METHOD, BONDING SUBSTRATE, SUBSTRATE BONDING METHOD, BONDING-SUBSTRATE FABRICATION APPARATUS, AND SUBSTRATE ASSEMBLY

TECHNICAL FIELD

The present invention relates to a substrate bonding technology for bonding together substrates (solid materials), and particularly relates to a method for fabrication of a bonding surface of a substrate to be bonded, a method for bonding substrates, and a substrate assembly.

BACKGROUND ART

In the field of electronic components, for example, solid materials are bonded together during wafer bonding wherein silicon substrates, substrates having an oxide layer or nitride layer formed on a silicon or other substrate, or substrates of glass material are bonded together, during bonding of metal materials between electronic components in flip-chip processes, and during package sealing when preparing MEMS (Micro Electro Mechanical Systems).

When bonding substrates, it is common to raise the strength of the bonding interface by heating to a high temperature after contact to promote chemical reactions between the bonding substrates and atomic diffusion in the vicinity of the bonding interface (bonding with heat treatment).

For example, in a method for bonding silicon wafers, the surfaces of silicon wafers may be hydrophilized, the pair of wafers joined by a van der Waals force, then subjected to a heat treatment at about 1000° C. to obtain a firm bond. Additionally, in anodic bonding, silicon and heat-resistant glass can be firmly bonded by applying a high voltage of 1 kV at 400° C.

However, bonding methods involving heat treatments are limited by the types of substrates to which they can be applied. In particular, when bonding together substrates of different materials, the differences in the coefficients of thermal expansion between the materials may result in increased residual thermal stresses and cause mechanical damage to the bonded materials as the temperature falls to room temperature (standard temperature), and as the residual stress becomes higher, the bonded materials may be destroyed. Additionally, bonding methods involving heat treatments are difficult to apply to bonding of components having elements with low heat resistance and voltage resistance, such as MEMS.

Standard-temperature bonding methods have been proposed for performing substrate bonding at room temperature, in order to overcome the detrimental influence that bonding methods involving heat treatments have on substrate materials. In this type of room temperature bonding method, the substrate surface is treated to a surface treatment such as cleaning or activation by irradiating the substrate with a particle beam, and the surface-treated substrate surfaces are brought into contact in a vacuum at room temperature for bonding.

Such standard temperature bonding methods extend the types of substrate materials that can be applied compared to bonding methods involving heat treatments, and have met with a degree of success. However, substrate materials (e.g., silicon oxide, silicon nitride, aluminum oxide and some other ceramic materials) that are difficult to apply to such room temperature bonding methods are known, so improvements are sought.

RELATED ART DOCUMENTS

Patent Documents

Patent Document 1: JP H10-92702 A
Patent Document 2: JP H06-099317 A
Patent Document 3: JP 2004-337927 A
Patent Document 4: JP 2007-324195 A
Patent Document 5: JP 2008-207221 A
Patent Document 6: JP 2010-046696 A

SUMMARY OF THE INVENTION

Problems to be Solved by the Invention

The present invention is an attempt to widen the range of applications of substrate and respond to the need for an improved substrate bonding technology by relaxing the required bonding environment conditions.

Specifically, the present invention has the purpose of offering a method of fabricating a bonding surface that ensures sufficient bonding strength irrespective of the type of substrate material used.

Furthermore, the present invention has the purpose of offering a bonding substrate fabricated with a bonding surface having a sufficient bonding strength capability even without being limited by the type of substrate material. Similarly, it has the purpose of offering a substrate assembly obtained by bonding such bonding substrates.

Furthermore, the present invention has the purpose of offering an apparatus for fabricating bonding surfaces having sufficient bonding strength potential, capable of being applied to various types of substrates.

Means for Solving the Problems

According to one aspect, the present invention offers a bonding substrate fabrication method for fabricating a substrate ("bonding substrate") on which a bonding surface is formed, the bonding substrate fabrication method comprising:

a surface treatment step of surface-treating a surface of a substrate by irradiation with radiated particles including energetic particles; and a step of forming a silicon thin film on the surface-treated substrate surface to fabricate the bonding substrate. The unexpected effects achieved by this arrangement (silicon thin film insertion-type bonding substrate fabrication method) can be read from a bonding strength comparison graph (FIG. 4) relating to different processes (FIG. 2).

Preferably, the surface treatment step includes a process of irradiating the substrate surface with radiated particles including metal particles. The unexpected effects of this arrangement are confirmed by bonding strengths C and E (FIG. 4) for processes C and E (FIG. 2).

According to another aspect, the present invention offers a bonding substrate fabrication apparatus for fabricating a substrate ("bonding substrate") on which a bonding surface is formed, the bonding substrate fabrication apparatus comprising:

a process chamber;

an energetic particle source disposed inside the process chamber (process room), for surface-treating a surface of the substrate by irradiation with radiated particles including energetic particles; and a silicon source disposed inside the process chamber, for forming a silicon thin film on the surface-treated substrate surface. This apparatus can be applied to the silicon thin film insertion type bonding substrate fabrication method of the present invention.

In another aspect, the present invention offers a bonding substrate fabrication apparatus for fabricating a substrate ("bonding substrate") on which a bonding surface is formed, the bonding substrate fabrication apparatus comprising:

an energetic particle source for radiating radiated particles including energetic particles;

a silicon source; and an orientation control device for controlling an orientation of the energetic particle source;

wherein the orientation control device, in a surface treatment mode, arranges the energetic particle source in a first orientation to direct radiated particles from the energetic particle source to the substrate surface; and in a silicon thin film forming mode wherein a silicon thin film is formed on the substrate surface, arranges the energetic particle source in a second orientation to direct radiated particles from the energetic particle source to the silicon source; and wherein the silicon source, in the silicon thin film forming mode, is arranged in an orientation for radiating silicon particles toward the substrate surface in response to radiated particles from the energetic particle source. This arrangement offers a bonding substrate fabrication apparatus that is suitable for performing a sputter-based silicon thin film insertion type bonding substrate fabrication method. The energetic particle source cooperates with the orientation control device and has two functions, functioning as an energetic particle source for irradiating the substrate during a surface treatment mode, and functioning as a sputter-type drive source for the silicon source during a silicon thin film forming mode.

Furthermore, in yet another aspect, the present invention offers a substrate assembly comprising:

a pair of substrates that are bonded to each other; and an interface layer having silicon as a main component formed between the pair of substrates;

the substrate assembly including a metal between the interface layer and at least one substrate of the pair of substrates;

wherein the bonding strength between the substrates is at least 0.5 J/m$^2$.

BRIEF DESCRIPTION OF THE DRAWINGS

FIG. 1 An external view of a substrate bonding system G00 comprising a load-lock apparatus G02, a bonding substrate fabrication apparatus G01 and a substrate bonding apparatus G03.

FIG. 2 A flow chart showing multiple processes (bonding substrate fabrication methods) for fabricating a bonding surface on a substrate, these processes including processes (bonding substrate fabrication methods) for forming a silicon thin film in the bonding layer based on different embodiments of the present invention.

FIG. 3 (A) is a schematic view showing portions of a substrate fabrication apparatus G01 associated with implementation of the irradiation step (surface treatments F03, F05) of FIG. 2 based on an embodiment of the present invention, and (B) is a schematic view showing portions of a substrate fabrication apparatus G01 associated with implementation of the silicon thin film formation step (process F04) of FIG. 2 based on an embodiment of the present invention.

FIG. 4 A graph showing the bonding strength of bonding substrates A to E obtained by processes A to E in FIG. 2.

FIG. 5 A schematic view showing a mechanical component of the substrate bonding apparatus G03 for bonding together bonding substrates, where (A) shows a pair of bonding substrates before bonding by the mechanical component and (B) shows the bonding substrates at the time of bonding by the mechanical component.

FIG. 6 (A) is a schematic view showing a sectional structure of bonding substrate E obtained by process E in FIG. 2 based on an embodiment; (B) is a schematic view showing a sectional structure of a substrate assembly obtained by bonding together bonding substrates (E), and (C) is a schematic view showing a sectional structure of a substrate assembly based on another embodiment.

FIG. 7 (A) is an infrared transmission image of substrate assembly A obtained by process A in FIG. 2 showing the formation of a void M12; and (B) is an infrared transmission image of substrate assembly E obtained by process A in FIG. 2 wherein the formation of a void is not observed.

FIG. 8 A transmission electron microscope photograph showing the microstructure of a cross section of substrate assembly E near the bonding interface.

FIG. 9 An EELS scan by transmission electron microscopy representing the iron concentration distribution in the direction perpendicular to the bonding interface at and near the interface layer of the substrate assembly E.

FIG. 10 A graph showing the bonding strengths of combinations N01, N02, N03 and N04, as well as under vacuum conditions at the time of bonding (N04 and N05) according to examples of the present invention.

FIG. 11 (A) is a front view schematically showing positions 1 to 5 at which the etched amount on the substrate H06 due to particle beam H05 radiated from the particle beam source H03 was measured in an example of the present invention. (B) is a plan view thereof.

FIG. 12 A graph showing the relationship between the acceleration voltage of the particle beam H05, and the amount etched at positions 1 to 5 on substrate H06.

FIG. 13 A perspective view of a linear particle beam source H03 based on an embodiment.

FIG. 14 A section view along the line P1P2P3 of the linear particle beam source H03 in FIG. 13.

FIG. 15 A schematic view showing the structure and actions of a bonding surface fabrication apparatus based on an embodiment.

FIG. 16 A schematic view showing the structure and actions of a bonding surface fabrication apparatus based on an embodiment.

FIG. 17 A schematic view showing the structure and actions of a bonding surface fabrication apparatus based on an embodiment.

FIG. 18 A diagram showing the relationship between a memory SS01 storing a lookup table and a control device SS02, and particle beam source FG20 and particle beam source FG30.

FIG. 19 A diagram showing the relationship between a computer S01, a power supply S02 for applying an acceleration voltage based on an instruction S03 therefrom, and a particle beam source H03.

FIG. 20 A lookup table for providing an acceleration voltage E(V) necessary for obtaining a predetermined bonding strength for respective materials depending on the particle beam sources G1, G2 used.

FIG. 21 (A) is a schematic view showing a process for radiating energetic particles from one particle beam source FG10 to remove an oxide film FG02 or impurities FG03 on the surface of the substrate FG01, and (B) is a schematic view showing a process for forming a bonding layer FG04 on the substrate FG01.

FIG. 22 (A) is a schematic view showing, as a first step, a process of radiating a particle beam from one particle beam source FG20 to remove an oxide film FG02 or impurities FG03 on the surface of the substrate FG01; (B) is a schematic view showing a subsequent process of radiating energetic particles from one particle beam source FG20 to form an amorphous bonding layer on the surface; and (C) is a schematic view showing, as a subsequent second step, a process of using particle sources 30 radiating different amounts of metal particles to irradiate the substrate FG01 with metal particles FG31 to form a final bonding layer FG04.

FIG. 23 A schematic view showing a process of emitting metal particles by sputtering with energetic particles based on an embodiment of the present invention.

FIG. 24 A section view schematically showing how metal particles F22 are contained in an amorphized surface layer FG04.

FIG. 25 Measurement results of the iron concentration distribution in the depth direction showing that a peak concentration of iron occurs at the surface layer of the silicon substrate based on an example of the present invention.

FIG. 26 A schematic view showing a specific example of an apparatus for implementing the bonding surface fabrication and substrate bonding according to the present invention.

FIG. 27 A schematic view showing an embodiment of particle radiation and a bonding mechanism according to the apparatus of FIG. 26.

FIG. 28 A view showing the structure of a position recognition portion according to the apparatus of FIG. 26.

FIG. 29 A schematic view showing a specific example of an energetic particle source.

FIG. 30 A schematic view showing a specific example of an energetic particle source further having a horn-shaped metal body.

FIG. 31 A graph showing a specific example of the relationship between the acceleration voltage of energetic particles and bonding strength.

FIG. 32 An iron $2p$ spectrum of a substrate surface after separating substrates bonded under different conditions.

MODES FOR CARRYING OUT THE INVENTION

First, the basic terminology used in the present specification will be explained. The term "substrate" is synonymous with "solid-state material", and a substrate may be of any shape. In the preferred embodiments explained below, the substrate may take the form of a wafer. However, this is no more than an example, and is not limiting. An "energetic particle" may be an inert gas ion and/or a neutral atom. A "metal particle" may be a metal ion, a neutral metal atom and/or a cluster. An energetic particle source is a device that radiates energetic particles. The term "radiate" is synonymous with "emit". An "energetic radiated particle" or a "radiated energetic particle" is a particle radiated or emitted from an energetic particle source. For example, in a typical energetic particle source, the particles present in a plasma space (plasma particles) are accelerated by an electric field to capture energy, forming energetic particles that are then emitted (radiated) outside the plasma space. A "metal particle source" is a device for radiating or emitting metal particles. For example, a metal body will react with energetic particle radiation and radiate or emit metal particles. In that case, the combination of a metal body and an energetic particle source that radiates energetic particles onto the metal body constitutes a metal particle source. This type of metal particle source is known as a sputtering-type metal particle source.

Herebelow, the present invention will be explained in detail by referring to preferred embodiments. However, these specific embodiments are merely exemplary, and are not intended to limit the present invention. The principles of the present invention, the above-described and other purposes, characteristics and advantages will become more apparent from the detailed description provided below with reference to the drawings.

<Overall System>

FIG. 1 shows the outward appearance of a substrate bonding system G00. Such a system G00 typically includes a load-lock apparatus G02, a bonding substrate fabrication apparatus G01 and a substrate bonding apparatus G03. The outward appearance itself and the specifics of the outward appearance of the system G00 do not constitute a part of the present invention.

The load-lock apparatus G02 is an entry port for substrates and an exit port for bonding substrates or substrate assemblies. The bonding substrate fabrication apparatus G01 performs a process (bonding substrate fabrication method) for forming a bonding surface on a loaded substrate to fabricate a bonding substrate. In general, such a process requires a high-vacuum environment. For this reason, the bonding substrate fabrication apparatus G01 performs the processes with the inside of the process chamber H02 in a high-vacuum state (e.g., gas pressure $10^{-7}$ Pa). Normally, before introducing substrates into the process chamber H02, the inside of the load-lock apparatus G02 into which a substrate has been loaded is subjected to a depressurization operation to lower the pressure from atmospheric pressure to a predetermined vacuum.

The substrate bonding apparatus G03 is for fabricating a substrate assembly by bonding together bonding substrates. In a typical substrate bonding system G00 (FIG. 1), the substrate bonding apparatus G03 is coupled to a bonding substrate fabrication apparatus G01 so that their atmospheres are in communication, and is capable of receiving a supply of bonding substrates from the bonding substrate fabrication apparatus G01 and transferring the fabricated substrate assemblies through the bonding substrate fabrication apparatus G01 to the load-lock apparatus G02 which is the exit port. Normally, in a substrate bonding system G00, the exchange of substrates, bonding substrates, substrate assemblies and the like between processing devices is performed by a robot.

According to the conventional art, a substrate bonding apparatus G03 requires an atmosphere in a vacuum state, and bonding (adhesion) of bonding substrates is performed in a vacuum. As described below, according to one aspect of the present invention, the substrate bonding apparatus G03 does not require a vacuum atmosphere. In a preferred embodiment of the present invention, a bonding substrate fabricated by a bonding substrate fabrication apparatus G01 does not require bonding in a vacuum atmosphere. Therefore, in an embodiment of the present invention, the substrate bonding apparatus G03 may be an independent apparatus separate from the bonding substrate fabrication apparatus G01.

As described above, the bonding substrate fabrication apparatus G01 fabricates bonding substrates by forming bonding surfaces on the received substrates. Herebelow, some embodiments shall be explained regarding the bonding substrate fabrication method performed by the bonding substrate fabrication apparatus G01, and associated portions of the bonding substrate fabrication apparatus involved in performance of the method.

FIG. 2 is a flow chart showing several processes (bonding substrate fabrication methods) for forming a silicon thin film-implanted bonding surface on a substrate based on different embodiments of the present invention. These processes are performed by the bonding substrate fabrication apparatus G01. In a first step, a starting substrate is obtained (F01), then preprocessing (F02) is performed to result in a substrate on which a bonding surface is to be formed.

In a specific example, commercially available silicon substrates for industrial use with a diameter of 150 mm were used as the starting substrate. Additionally, during preprocessing, an oxide film was formed on the surface of the silicon substrate by subjecting the silicon substrate to conventional thermal oxidation.

Returning to the flow diagram of FIG. 2, after the preprocessing F02, a bonding substrate fabrication process for forming a silicon thin film-implanted bonding surface on the substrate is performed according to different embodiments of the present invention. As selectable processes, FIG. 2 shows five processes A to E.

Process A is a process (bonding substrate fabrication method) wherein the substrate surface is subjected to only a surface treatment ("irradiation" step F03). Unlike the other processes B-E, a silicon thin film is not formed (F04) on the bonding surface. The substrate fabricated by this process will be referred to as the bonding substrate A. Therefore, process A is a comparative reference process, and substrate A is a comparative reference substrate.

Process E is a process in which surface treatment (F03) of the substrate surface is followed by formation of a silicon thin film on the surface-treated substrate surface (F04), then by surface treatment of the formed silicon thin film surface (F05). The substrate fabricated by this process will be referred to as substrate E. In a specific example, as shown in FIG. 6(A), the bonding substrate E (L00) is such that the surface of the silicon oxide film L01 is surface-treated (L02), a silicon thin film (L03) is formed on the surface, and the silicon thin film is surface-treated (L04).

Process C is the same as process E up to the surface treatment F03 of the substrate surface and the silicon thin film formation F04, but the final silicon thin film surface treatment F05 is not performed. The result will be referred to as the bonding substrate C. In the specific example, bonding substrate C is a substrate having a silicon oxide film surface that is surface-treated, and a silicon thin film formed on the surface thereof.

Process D is a process wherein the substrate surface is not subjected to a surface treatment F03, a silicon thin film is formed directly thereon (F04), and the formed silicon thin film surface is surface-treated (F05). The substrate fabricated in this way will be referred to as bonding substrate D. In a specific example, bonding substrate D is a substrate wherein the silicon oxide film surface is not surface-treated, a silicon thin film is formed, and further subjected to a surface treatment.

Process B is a process wherein a silicon thin film is formed (F04) directly on the substrate surface. The substrate obtained in this way will be referred to as bonding substrate B.

As shown in FIG. 4 to be described below, the bonding strengths of bonding substrates B to E according to the embodiments exhibited unexpected differences with respect to the comparative reference substrate A.

In the following explanation, the surface treatment F03 of the substrate surface may be referred to as "step 1", the silicon thin film formation process F04 may be referred to as "step 2", and the surface treatment F05 of the silicon thin film surface may be referred to as "step 3".

FIG. 3 schematically shows the relevant portions of a bonding substrate fabrication apparatus G01, along with a process chamber H02, suitable for performing steps 1 and 3, and step 2 (surface treatment, and silicon thin film formation process) of FIG. 2. Basically, in order to perform a surface treatment, a particle source for irradiating the substrate with energetic particles is needed (see H03). Additionally, the silicon thin film may be formed with a silicon source by CVD using a CVD apparatus or PVD using a PVD apparatus, but FIG. 3 shows a sputtered silicon source (see H10).

As shown in FIG. 3(A), the process chamber H02 is set to a pressure of $10^{-7}$ Pa as a vacuum before processing is started. Inside the process chamber H02, the substrate H06 is supported on the substrate supporting portion H08. Furthermore, an energetic particle source H03 is provided so as to be capable of irradiating the substrate H6 with radiated particles H05 including energetic particles or metal particles. The energetic particle source H03 has an axis of rotation H04 in a direction perpendicular to the drawing, and the orientation of the energetic particle source H03 may be controlled about the axis of rotation H04. This constitutes a simple orientation control apparatus. If desired, the orientation control apparatus may control the orientation of the energetic particle source H03 about multiple axes.

Therefore, in FIG. 3, the bonding substrate fabrication apparatus includes an energetic particle source H03 for emitting radiated particles including energetic particles, a silicon source H10, and an orientation control apparatus H04 for controlling the orientation of the energetic particle source H03. The orientation control apparatus H04, in a surface treatment mode according to steps 1 and 3, puts the energetic particle source H03 in a first orientation to direct the radiated particles from the energetic radiation source H03 toward the substrate H06 surface, and in a silicon thin film formation mode for forming a silicon thin film on the substrate surface according to step 2, orients the energetic particle source in a second orientation to direct radiated particles from the energetic particle source H03 toward the silicon source H10. In the silicon thin film formation mode, the silicon source H10 responds to the radiated particles from the energetic particle source H03, and is oriented to radiate silicon particles toward the surface of the substrate H06.

Additionally, the substrate supporting portion H08 should preferably support a plurality of substrates in addition to the substrate H06. For example, in FIG. 3(A), a substrate H07 is further supported.

More preferably, the substrate supporting portion H08 includes a mechanism H09 that moves in the lateral direction in FIG. 3(A), and by translation of the substrate supporting portion H08 with respect to the energetic particle source H03 by the movement mechanism H09, the substrates H06 and H07 are able to be sequentially irradiated by the radiated particles.

Having a movement mechanism H09 provides various advantages in the process.

For example, due to the movement mechanism H09, the substrate H06 can be moved outside the range of irradiation of the radiated particles H05 at the time of ignition of the energetic particle source H03. Irradiation of the substrate H06 under unfavorable conditions such as instability immediately following ignition of the energetic particle source H03 can be avoided.

Additionally, for example, after processing of the substrate H06, the movement mechanism H09 may consecutively or continuously subject another substrate H07 held by the substrate supporting portion H08 to irradiation by the radiated particles H05. As a result, the speed and efficiency of the overall process may be improved.

Furthermore, for example, a linear particle source that is long in the position direction (linear ion source) may be used as shown in FIG. 13, and by arranging it in the direction perpendicular to the paper surface in FIG. 3(A), a substrate of large dimensions may be efficiently processed.

The energetic particle source H03 can emit radiated particles including energetic particles. These energetic particles may be inert particles, preferably including argon.

The energetic particle source H03 may further emit radiated particles including metal particles. These metal particles are preferably transition metals, more preferably iron.

A particle source H03 (energetic particle source and metal particle source) emitting both energetic particles and metal particles may have various structures.

In one structural example, this type of particle source H03 which emits both energetic particles and metal particles generates a plasma of inert particles (argon), and by applying an electric field E to this plasma, the plasma inert particles are accelerated in the direction of the electric field, causing radiation of energetic particles including inert particles. Inside the particle source H03, an exposable metal body including a desired metal is arranged in the area where the plasma of the inert particles (argon) is generated, so that the energetic particles from the plasma also cause radiation of metal particles from the metal body, which form a portion of the radiated particles. The particle source of this structure functions mainly as the particle source for radiating energetic particles when the metal body is in a retracted position by selection of an active mode, and functions as a particle source for radiating metal particles together with energetic particles when the metal body is in an exposed position (positioned in the plasma space).

In this type of particle source H03, the proportion of metal particles contained in all radiated particles or the quantity relative to the energetic particles (here, inert particles) may be enhanced or controlled by various methods.

In one structural example, a conical metal body is further provided at the exit of the particle source H03, and the energetic particles (here, inert particles in a plasma state) sputter the metal body, thereby increasing the quantity of metal particles radiated from the particle source.

In another structural example, a grid-shaped metal body is further provided at the exit of the particle source H03, so that the energetic particles (here, inert particles in a plasma state) sputter the metal grid, thereby increasing the quantity of metal particles emitted.

The proportion of metal particles contained in all the radiated particles or the amount relative to the energetic particles (e.g., inert energetic particles) are not limited to those for the above structural examples. For example, the metal body for generating the metal particles may be provided at any position, even a position distanced from the particle source, as long as the position is between the particle source and the substrate which is the irradiation target, and exposed to irradiation by particles including energetic particles. Additionally, the shape of the metal body may be any shape capable of achieving the same objective.

Next, an embodiment of a method and apparatus for sputter deposition of a silicon thin film according to the present invention will described with reference to FIG. 3(B).

FIG. 3(B) shows a structure having a silicon source H10 further inside the process chamber H02 shown in FIG. 3(A). Here, the silicon source H10 is positioned so as to be capable of radiating silicon H11 in the direction of the substrate H06 on which the silicon is to be deposited, and is further arranged to be capable of receiving radiated particles H05 from the particle ion beam H03 for radiating silicon. Here, the particle ion beam H03 rotates about the axis of rotation H04 from the position shown in FIG. 3(A), and is radiated in the direction of the silicon source H10.

In the embodiments shown in FIG. 3(A) and FIG. 3(B), the energetic particle source H03 and silicon source H10 are arranged with respect to the substrate H06 inside the process chamber H02, enabling a single energetic particle source H03 to be used to irradiate the substrate H06 with radiated particles and perform sputter deposition of a silicon thin film onto the substrate H06. By doing so, the arrangement of components inside the process chamber H02 can be simplified.

As described above, the substrate bonding apparatus G03 is for bonding together bonding substrates. The substrate bonding mechanism G03 is not limited, but a mechanism functioning, for example, as shown in FIG. 5 is preferred. In other words, the substrate supporting portion H08 has a supporting portion H08a and a supporting portion H08b for respectively supporting the substrate H06 and the substrate H07. The supporting portion H08a and the supporting portion H08b respectively pivot about an axis of rotation H12 that is perpendicular to the paper surface of FIG. 5, enabling the bonding surfaces of the substrate H06 and the substrate H07 to come into planar contact. Because the bonding fabrication apparatus G00 has this mechanism, the substrates can be bonded together in a desired time and conditions inside the process chamber H02 or other vacuum chamber (not shown) without being removed from the bonding surface fabrication apparatus G00.

In a specific example, after fabricating bonding substrates with the bonding substrate fabrication apparatus G01 based on processes A to E in FIG. 2, pairs of substrates A to E obtained by the same process can be bonded in the substrate bonding apparatus G03 as shown in FIG. 5(B) using the mechanism shown in FIG. 5. The pairs of bonded substrates will be referred to hereafter as substrate assemblies A to E.

The structure of substrate assembly E is shown in FIG. 6(B). In specific examples, for substrate E, the surface of the silicon oxide film L01 is irradiated (L02) in step 1, a silicon thin film (L03) is formed on the surface thereof, and the silicon thin film is irradiated (L04) according to step 1. By bonding together a pair of substrates E processed in the same way, the surfaces L04 are bonded together, forming the substrate assembly E (L10).

<Measurement of Bonding Energy>

After the bonding process, the substrate assemblies A to E were removed from the substrate bonding system G00 into air, and the bonding energies of the substrate assemblies were measured by a blade insertion method. The average values over a plurality of measurements of substrate assemblies A to E are shown in FIG. 4.

The measurement results for bonding strength will be explained with reference to FIG. 4. First, the substrate assembly A obtained by bonding together substrates on which a silicon film was not formed and wherein the silicon oxide film was irradiated by step 1 exhibited the lowest bonding strength (0.05 J/m$^2$ or less). Next, substrate assembly B obtained by bonding together substrates on which a silicon film was formed without performing step 1 at all exhibited a bonding strength (0.37 J/m$^2$) which is higher than substrate assembly A. This is a bonding strength of about 15% of the breaking strength (2.5 J/m$^2$) of bulk silicon. Next, the substrate assembly D obtained by bonding together substrates on which a silicon film was formed without performing step 1, then followed by step 1, exhibited a bonding strength (0.51 J/m$^2$) which is higher than the bonding strength of the substrate assembly B. This is a bonding strength which is about 20% the breaking strength (2.5 J/m$^2$) of bulk silicon. Next, the substrate assembly C obtained by bonding together substrates on which a silicon film was formed after performing step 1, then not followed by step 1, exhibited a bonding strength (1.17 J/m$^2$) which is even higher than that of substrate assembly D. This is a bonding strength which is about 40% of the breaking strength (2.5 J/m$^2$) of bulk silicon. Finally, the substrate assembly E obtained by bonding together substrates on which a silicon film was formed after performing step 1, then followed again by step 1, exhibited the highest bonding strength (1.55 J/m$^2$). This is a bonding strength that is about 60% of the breaking strength (2.5 J/m$^2$) of bulk silicon.

The results for bonding strength shown in FIG. 4 show that substrates on which a silicon film is formed clearly exhibit higher bonding strength than substrates on which a silicon film is not formed, and that the bonding strength becomes greater the more step 1 is performed before and after formation of the silicon film.

In the above examples, pairs of substrates subjected to the same processes were bonded together to compare the bonding strengths of the substrate assemblies depending on the processing methods, but similar effects are clearly achieved even when processing only one substrate.

In the above examples, silicon oxide was used as the substrate (surface layer portion), but there is clearly no need for such a limitation. Additionally, by forming the silicon thin films inside the bonding surface layers, the broadness of the range of application wherein there are fundamentally no limitations on the materials of the substrates themselves can be observed. As a result, the present invention may be applied to the material of any substrate as long as irradiation of the substrate surface by energetic particles and generation of a silicon thin film is possible.

Additionally, in the above examples, radiated particles including energetic particles and metal particles were used as the particle source H03. However, it is clear from the results of room temperature bonding methods performed until now that similar results can be obtained even when metal particles are not included, or when metal particles are intentionally left out of the energetic particles by installing a grid or horn-shaped metal body.

<Evaluation of Bonding Interface by Infrared Transmission>

While visible light cannot pass through a silicon substrate, infrared light can. Therefore, the state of bonding can be analyzed by using a technique of observation of transmission of infrared rays. The portions where the substrates are not closely bonded form spaces, or so-called voids, where the optical path lengths of infrared rays differ from those where the substrates are closely bonded. When viewing an image of infrared rays transmitted through the substrates, the places where the substrates are and are not closely bonded appear as differences in darkness and lightness of the transmitted light.

The formation of voids suggests that undesirable particles adhering to the bonding surface are present in the bonding interface, forming gaps between the substrates, or that the bonding strength is weak.

FIG. 7(A) shows an infrared ray transmission image of substrate assembly A (M11), and FIG. 7(B) shows an infrared ray transmission image of substrate assembly E (M21). In FIG. 7(A), voids can be observed to have formed in the areas denoted by M12. On the other hand, in FIG. 7(B), the formation of voids such as those indicated by M12 in FIG. 7(A) was not observed.

Substrate E involves many steps compared to substrate A, and therefore can be expected to have a higher probability of adherence of undesirable particles to the bonding surface before bonding. The fact that voids nevertheless did not form on the substrate assembly E suggests that the bonding strength of the substrate assembly E is much higher than that of substrate assembly A, which agrees with the results of bonding strength shown in FIG. 4.

<Evaluation of Bonding Interface by Transmission-Type Electron Microscopy>

FIG. 8 shows the microscopic structure in the vicinity of the bonding interface of substrate assembly E as viewed by transmission electron microscopy. In this specific example, the substrate was obtained by forming a surface of a silicon oxide film L01 on a silicon substrate (L10) as a starter material, irradiating by step 1 (L02), forming a silicon thin film on the surface (L03), then irradiating the silicon thin film by step 1 (L04). By bonding together a pair of similarly processed substrates E, the surfaces L04 bond together to form a substrate assembly E (L10).

Furthermore, the iron concentration in the vicinity of the bonding interface of the substrate assembly E was measured using a technique called EELS in transmission electron microscopy. EELS scanning enables the concentration of atoms to be measured for extremely small areas of atomic size. FIG. 9 shows the concentration profile of iron in a direction perpendicular to the bonding interface (K31), measured by line-scanning the bonding interface L04 in a perpendicular direction.

In this specific example, with an EELS line scan in a direction perpendicular to the bonding interface L04, iron was found to be present at positions L02 and L04 which were irradiated with energetic particles in step 1, but was not measured in any other areas. Furthermore, the concentration of iron at the bonding interface L04 was higher than at the area L02 irradiated by energetic particles before deposition of the silicon thin film L03. This is believed to correspond to the fact that twice as much iron is contained by joining surfaces irradiated with energetic particles under the same conditions in step 1.

In the above example, the iron concentration distribution in the direction perpendicular to the bonding interface is shown in the vicinity of the bonding interface of a substrate assembly E obtained by bonding together a pair of substrates E subjected to similar processes, but a similar iron distribution can clearly be obtained even when just one substrate is processed as shown in FIG. 6(C).

FIG. 6(C) will be explained. In this case, the surface of one substrate L01 is irradiated by step 1 (L02), a silicon thin film (L03) is formed on the surface thereof, the silicon thin film is irradiated by step 1 (L04), then the substrate is bonded with another substrate L41. However, aside from when the substrate L01 and L41 can be distinguished, it is difficult to determine whether the bonding interface is in L02 or in L04 by observation of the interface structure alone, and it does not matter whether step 1 and step 2 are performed on substrate L01 or substrate L41.

Additionally, in the relevant portions of L02 and L04, the metals included in other energetic particles are present at a higher concentration than other portions.

These metals are preferably transition metals, more preferably iron.

Regarding the activation conditions for the particle source, in a specific example, step 1 is performed with an acceleration voltage of 1.5 to 2.5 kV and a current of 350 to 400 mA, and step 2 is performed with an acceleration voltage of 1.0 to 2.0 kV and a current of 300 to 500 mA.

Hereinabove, a method and apparatus for fabricating a bonding substrate of a type having a "silicon thin film layer" formed inside the bonded layer (see FIG. 2), a bonding substrate which is the product thereof (FIG. 6), and a substrate assembly (FIG. 6) have been explained. As shown in FIG. 4, the bonding substrate was found to have a higher bonding capacity compared to other cases when forming a silicon thin film inside the bonded layer as shown in FIG. 4. Additionally, the present method and apparatus have no limitations on the materials of the substrate to which they can be applied, and they are very highly effective.

Herebelow, the approach of forming a "silicon thin film layer" inside the bonded layer is set aside, and sufficient bonding strength is achieved by making improvements to the surface treatments of the substrate (see FIG. 6, layers L02 and L04).

<Bonding Surface Fabrication Process>

Herebelow, the surface treatment will be explained in detail with reference to embodiments.

These embodiments offer a bonding substrate fabrication method for fabricating substrates on which a bonding surface has been formed ("bonding substrates"). This method includes a first surface treatment step of surface-treating the surface of a substrate by irradiation with radiated particles including energetic particles, and a second surface treatment step of surface-treating the substrate surface by irradiation with radiated particles including metal particles. As a result of performing these steps, the aforementioned bonding substrates are produced, and the performance of the steps is controlled so that the metal particles are distributed within the base material of the surface layer of the bonding substrate. In this case, the first surface treatment step and the second surface treatment step may be performed simultaneously. This was already explained in connection with the energetic particle source and metal particle source H03 shown in FIG. 3. Instead of simultaneous processes, a sequential process could be used wherein the substrate surface is subjected to energetic particle radiation, after which the substrate surface is subjected to metal particle radiation. Depending on the application, an energetic particle source and metal particle source H03 may be used, or the action of an energetic particle source may be followed by the action of a metal particle source.

As a bonding substrate fabrication apparatus G01 for forming a bonding surface of a substrate, FIG. 18 shows a bonding substrate fabrication apparatus comprising an energetic particle source FG20 for surface-treating a surface of a substrate by irradiation with radiated particles including energetic particles, a metal particle source FG30 for surface-treating the surface of the substrate by irradiation with radiated particles including metal particles, a processing condition memory SS01 for storing processing conditions satisfying the targeted properties of the bonding substrate ("target properties"), and a control device SS02 for referring to the memory SS01 and controlling the energetic particle source FG20 and the metal particle source FG30 based on the processing conditions satisfying the target properties.

For example, the above-mentioned target properties may include a distribution of metal particles inside the base material of the surface layer of the bonding substrate, and the actions of the energetic particle source FG20 and the metal particle source FG30 may be controlled based on the processing conditions satisfying the target properties under the control of the control device SS02.

The target properties may include (A) absence of a metal layer on the surface layer of the bonding substrate, and (B) distribution of the metal particles inside the base material of the surface layer of the bonding substrate, and the actions of the energetic particle source FG20 and the metal particle source FG30 may be controlled based on the processing conditions satisfying the above-mentioned target properties under the control of the control device SS02.

In one example, the above-mentioned processing conditions may include energy conditions to be acquired by the energetic particles from the energetic particle source FG20. The energy conditions may be 30 eV or more.

In another example, the above-mentioned target properties include "the bonding substrate having a certain bonding strength capability", and the actions of the energetic particle source FG20 and the metal particle source FG30 may be controlled based on processing conditions satisfying the above-mentioned target properties under the control of the control device SS02. For example, lookup tables T01, T02 such as those shown in FIG. 20 may be stored in the processing condition memory SS01, capable of displaying bonding strengths (expressed, for example, as substrate breaking strength ratios).

As an alternative, as shown in FIG. 19, the control portion S01 illustrated in the form of a PC may contain therein a memory storing processing requirements relating to the energy requirements, and a power supply S02 may be provided with voltage instructions corresponding to required acceleration energies via the data bus S03. Upon receipt thereof, the energetic particle source H03 is activated at voltages corresponding to the required acceleration energies from the power supply S02 through the power supply line S04.

<Process of Surface Treatment by Energetic Radiated Particles>

The surface treatment based on one embodiment is a process of irradiating the substrate surface with energetic radiated particles. Generally, the surface of the solid material originally on the substrate has a certain amount of oxides and compounds other than oxides formed or adsorbed thereto. The oxides are often formed by the substrate material reacting with oxygen in the air or with water in a wet process. In the case of silicon, they are mostly $SiO_2$. Aside from oxides, microparticles from the air may be adsorbed, or chemical substances from various processes may adsorb to the surface or react with and form on the substrate material. There are many forms and types, but they will be referred to simply as "impurities" in the present specification.

The purpose of "surface treatment" is first to remove the above-mentioned oxides and impurities by collisions of radiated particles including energetic particles, and exposing the clean surface of the substrate material itself. The surface of the substrate material itself has dangling bonds and is in a high-energy, unstable state. By avoiding oxidation and adsorption of impurities and bringing into contact another energetically unstable clean surface, the dangling bonds can be bound together and become energetically stable, resulting in a strong bond.

The second purpose of "surface treatment" is to disrupt the crystallinity of the substrate material by further irradiating the clean surface with radiated particles including energetic particles, thereby accelerating the formation of dangling bonds and further raising the surface energy. Therefore, by joining these surfaces together, an even stronger bond can be obtained.

In the below-given examples, an inert gas, especially argon, was used for the radiated particles including energetic particles used for the "surface treatment", but the invention is not limited thereto. For example, other inert gases may be used, and aside from inert gases, any particles, such as nitrogen molecules and oxygen molecules, capable of transmitting to the substrate material kinetic energy obtained by being accelerated by the particle source, may be used. Additionally, instead of having kinetic energy, they may be chemically reactive with the substrate material.

Furthermore, the particle used for the particle radiation in the "surface treatment" may include multiple types of particles. For example, as described above or below, metal particles may be included. In that case, the metal particles that have reached the surface of the substrate material can be considered to undergo some kind of chemical reaction at the time of bonding, as a result of which the bonding strength is increased.

The "surface treatment" may be performed on both or on just one of the pair of substrate surfaces to be bonded.

The surface treatment method of the present embodiment was confirmed by measurements to contain metal particles in the surface-treated substrate surface layer (bonding surface layer). While the specifics of the phenomena actually occurring in the substrate surface layer during surface treatment are unclear, judging from the measurement results, it appears that irradiation by the energetic particles and metal particles removes oxides and impurities present on the substrate surface, the energy from the particles amorphizes the substrate surface layer, and the metal particles are bonded to the base material of the amorphized layer. The descriptions of these phenomena are merely hypothesized from the measurements as an attempt at a simple explanation. Phenomena per se, theories on phenomena per se and physical/chemical analysis per se cannot be protected by patents, and therefore do not constitute a portion of the present invention, nor are they intended to be used to interpret the scope of the present invention. The scope of the present invention, as defined by law, should be determined based on the claims.

A specific example of a surface treatment method based on the present embodiment wherein silicon is used as the substrate material, argon is used for the energetic particles and iron atoms are used as the metal will be described with reference to FIG. 24. In other words, in the substrate FG01, the silicon atoms FF11 are arranged in a diamond crystal structure. As a result of a surface treatment method under the present embodiment, the silicon substrate surface layer FG04 can be considered to lose its diamond crystal structure and the silicon atoms FF21 to form an amorphous layer FG04. The iron atoms FF22 can be considered to be present mainly in this amorphous layer FG04.

FIG. 25 shows the results of compositional analysis in the depth direction of a silicon substrate after irradiation by energetic particles and iron particles by RF glow discharge spectroscopy. These results show that there is an iron concentration peak in the surface layer and the peak concentration is 4.5 atomic % (hereinafter referred to as "at %").

Aside from the amorphous layer FG04, the iron atoms may, for example, be present on the substrate FG01. This is because the diffusion coefficients of transition metals in semiconductor materials are generally high, and for example, the diffusion coefficient of iron in silicon is extremely high (Sze, Physics of Semiconductor Devices). Therefore, even at room temperature, the diffusion coefficient of transition metals represented by iron is high. Additionally, even if the temperature of the substrate overall is held at room temperature or a temperature lower than room temperature, during irradiation with energetic particles, the energy of the energetic particles is converted into thermal energy by collisions, causing the temperature near the surface to rise locally within a range of a few atoms. Therefore, the diffusion distance of iron can be expected to increase near the surface. However, only the iron atoms positioned near the substrate surface are involved in the bonding process, while the iron atoms at positions deeper than the amorphous layer FG04 when viewed from the surface are not directly involved in the bonding process.

Additionally, the acceleration energy of iron atoms may be lower than the acceleration energy of argon which is an energetic particle. The diffusion rate of iron atoms is higher in amorphous silicon than in crystalline silicon, so the diffusion of iron atoms can be expected to be sufficient.

In order to obtain sufficient bonding strength, the surface layer FG04 made by the surface treatment method of the present embodiment should preferably comprise metals by 0.1 to 30 at %.

Furthermore, the surface layer FG04 formed by the surface treatment method according to the present embodiment should preferably comprise metals by 3 to 10 at %.

If the metal content is lower than the designated amount, then a sufficient bonding strength that can be expected by the presence of metals cannot be obtained.

Additionally, it may not be preferable for the metal content to be greater than the designated amount.

First, if the metal content is greater than the designated amount, then sufficient bonding strength may not be able to be obtained.

For example, a high bonding strength was obtained when, after the surface treatment, the substrate with an iron content of 5 at % in the surface layer FG04 was bonded after changing the gas pressure from vacuum to atmospheric pressure.

Additionally, a substrate having an iron content of 5 at % in the surface layer FG04, as a result of measurement, was found to have a slower oxidation rate than an iron metal film.

Various mechanisms may be contemplated as the reason for the slow iron oxidation rate. For example, when the iron content in the silicon is low, the probability of iron atoms being close to each other becomes extremely small, so the iron atoms can be considered to be isolated from other iron atoms. In that case, the iron atoms will bind with silicon atoms and form a silicon alloy. Silicon alloys are believed to be less susceptible to oxidation than when adjacent irons forms a metal film. Furthermore, when an iron atom is located at the surface layer FG04, one end of these iron atoms binds with silicon atoms, while the other end is exposed to the surface, and is not bound to silicon atoms or the like and therefore has a certain degree of activity. In other words, due to the fact that the amount of iron atoms on the outermost surface after the surface treatment does not exceed a certain amount, they can be considered to have the property of being less susceptible to oxidation, while having sufficient activity to generate a strong bond when contacting other substrate surfaces.

Additionally, the feature of the metal content being greater than a certain amount, in an unfavorable second case, generates conductivity.

For example, by increasing the metal content of the surface layer FG04, the metal atoms become continuous, forming metallic bonds. As a result of the continuous metallic bonds in surface layer FG04, the layer has conductivity. Additionally, even if not completely continuous, if metal atoms are present nearby at the atomic level, conductivity may arise as a result of the tunneling effect. Alternatively, even if the surface layer FG04 alone does not have conductivity, conductivity may arise as a result of bonding a pair of similar surface layers FG04.

In one example of the present embodiment, energetic particles and metal particles are radiated from the particle source, so the energy of the energetic particles and metal particles is defined by the particle source driving conditions. However, as mentioned above, the energetic particles and metal particles can be considered to play different roles in acting on the substrate material. If the amount of metal particles reaching the substrate material surface exceeds the amount of substrate material removed by energetic particles, then the metal particles will be deposited on the substrate material surface. In this case, a metal film is formed. On the other hand, if the amount of metal particles reaching the substrate material surface is less than the amount of substrate material removed by the energetic particles, then the metal particles will not be deposited onto the substrate material surface, and the substrate material will be progressively removed. In other words, the balance between the kinetic energy of the energetic particles and the amount of metal particles arriving at the substrate material surface is a factor in forming a desired thin film.

Next, experimental results relating to the relationship between bonding strength and the acceleration energy of energetic particles when using a 150 mm silicon wafer as the substrate material, specifically acceleration voltages of 80 V and 100 V, will be demonstrated.

First, the amount of substrate material removed by energetic particles was measured in the case of the above-described two acceleration voltages as shown in FIG. 11(A) and FIG. 11(B). FIG. 11(A) is a side view showing the positional relationship between the substrate H06, the energetic particle source H03 and the direction of emission of the energetic particles H05. FIG. 11(B) is a plan view of the same. As the substrate H06, a thermal oxide film was formed on a silicon substrate, the thickness of this thermal oxide film was measured before and after irradiation by energetic particles, and the difference in thickness was recorded as the etched amount. Energetic particles H05 were radiated from the energetic particle source H03 in an oblique direction with respect to the substrate surface so as to contain the center 3 of the substrate. Additionally, the thickness of the thermal oxide film was measured from point 1 to 5 in the direction of the diameter of the substrate H06, in other words, along the direction of radiation O05 of the energetic particles H05. At this time, the positions of the measurement points 1 to 5 were determined by positioning a notch O06 as shown in FIG. 11(B).

First, FIG. 12 shows the amount etched (nm) at measurement points 1 to 5 at 80 V and 100 V. At 80 V, the etched amounts were measured under the two conditions of radiation amounts 15 A-min and 30 A-min, and the etched amounts were confirmed to be roughly proportional to the amount of radiation. At 100 V, roughly the same results of etching amount as for 80 V and 30 A-min were obtained at measurement points 1 to 3, while etching amounts intermediate between the results for the two conditions at 80 V described above were measured at positions 4 and 5. In both cases, energetic particle radiation at the above-described 80 V and 100 V was found to provide roughly equivalent etching amounts in the thermal oxide film.

Silicon substrates were surface-treated with the same energetic particle acceleration voltages, and bonded together. In this case, no oxide film or any other thin film of anything other than silicon was formed on the silicon substrate surface, and the silicon materials were bonded together. Sufficient bonding strength was not obtained when the surface treatment was performed by accelerating the energetic particles at an acceleration voltage of 80 V, while sufficient bonding strength was obtained when the surface treatment was performed by accelerating the energetic particles at an acceleration voltage of 100 V. The measurement results show that even under energetic particle irradiation conditions providing similar amounts of etching, the bonding strength can differ depending on the acceleration voltage of a certain particle source, in other words, the kinetic energy of the energetic particles.

While the above example demonstrates the difference in bonding strength between energetic particle acceleration voltages of 80 V and 100 V using a predetermined particle source, this can change depending on various conditions. For example, depending on the irradiated material, the acceleration voltage may be 30 V (see FIG. 31). Additionally, for example, the kinetic energy of the energetic particles specifically depends on the arrangement of the particle source that is used. Furthermore, while silicon was used in the above example, the bonding strength depends on the type (semiconductor, ceramic, dielectric material, organic material, etc.) and form (monocrystalline material, crystal orientation at the material surface, polycrystallinity, size of crystal grains, etc.) of the material to be irradiated with energetic particles as well as the kinetic energy (energy of the particles). Therefore, the resulting bonding strength can be considered to depend on parameters such as the energy of the particles, materials irradiated and the particle source.

For example, as shown in FIG. 20, lookup tables T01, T02 can be prepared beforehand, showing the acceleration voltages E(V) necessary for obtaining a designated bonding strength BS (%) (=bonding strength $(J/m^2)$/bulk breaking strength $(J/m^2)$) for various materials such as $SiO_2$, Si, SiN and M4 depending on the particle source G1, G2 used.

By storing these lookup tables in a memory of a computer S01 as shown in FIG. 19, a user may enter desired parameters, whereupon the computer S01 will output to the power supply S02 an instruction S03 regarding the necessary acceleration voltage value. The power supply S02 will apply the instructed voltage to the voltage plate S05 of the acceleration voltage of the energetic particle source H03. As a result, the particles H05 accelerated by the predetermined voltage will be radiated form the energetic particle source H03. By providing a metal body S06 on the path of the particles H05, the energetic particles can be made to include metal particles.

As described above, by choosing the above-described parameters appropriately according to the present invention, a sufficient bonding strength can be achieved when the metal content in the surface layer of the substrate is within a predetermined range.

Next, as another example of the present invention, a method of adjusting the proportion between the radiation amount of energetic particles and metal particles in two different steps will be demonstrated. With reference to FIG. 21, the difference between the above-described example (FIGS. 21(A) and (B)) and the present example (FIG. 22(A) to (C)) will be explained.

In the above example, energetic particles are radiated from a single particle source FG10 to remove an oxide film FG02 and impurities FG03 on the surface of the substrate FG01 (FIG. 21(A)), forming the bonding layer FG04 on the substrate FG01 (FIG. 21(B)). When the energetic particles include metal particles, the metals will be contained in the formed bonding layer FG04.

In another example, as a first step, energetic particles were radiated from one particle source FG20 to remove an oxide film FG02 and impurities FG03 on the surface of the substrate FG01 (FIG. 22(A)), forming a bonding layer FG05 on the substrate FG01 (FIG. 22(B)). Next, as a second step, a particle source FG30 with a different amount of radiation of metal particles was used to irradiate the substrate FG01 with metal particles FG31, to form a final bonding layer FG04 (FIG. 22(C)). In the present example, the energetic particles in the first step may or may not include metal particles. Additionally, the particle source FG30 in the second step may simultaneously radiate energetic particles and metal particles as used in the above-described example. The amount of metal particles radiated can be increased or decreased by various methods. Additionally, this particle source FG30 need not have a mechanism for accelerating the particles. Basically, the embodiments exemplified by the present example enable the energetic particle irradiation conditions and metal particle irradiation conditions to be relatively freely set between a first step and a second step, so that their functions can be better controlled.

With the apparatus arrangement shown in FIG. 23, the energetic particle source does not radiate energetic particles toward the substrate H06, but rather toward the metal particle source FG30. The metal particle source FG30 reacts with the energetic particles FG21 so that metal particles FG31 are sputtered and radiated toward the substrate H06.

Therefore, the metal particle source FG30 is a sputtering target for the energetic particles FG21. A sputtering target wherein sputtering is appropriately switched between metal particles and silicon depending on the process is effective. For example, the sputtering target may be of a polygonal pillar shape having multiple faces and capable of rotation, provided with a silicon target on at least one surface, and a metal particle on at least one other surface. By using such a rotary sputtering target instead of a metal particle source FG30, after forming a silicon film on the substrate by radiating energetic particles at a silicon target to sputter silicon, the rotary sputtering target can be rotated so as to radiate the energetic particles onto the metal particle target to sputter metal particles (e.g., iron particles) and easily radiate metal particles onto the substrate.

<Relationship Between Substrate Material and Bonding Strength>

In connection with FIG. 4, formation of a silicon thin film insertion type substrate was explained. In particular, the substrate (surface layer) material was silicon oxide in the example shown in FIG. 4. In other words, while the material of the starting substrate was silicon, the surface was thermally oxidized to form silicon oxide, and in terms of the features of the present invention, the example used silicon oxide as the substrate. On the other hand, in the following specific examples wherein silicon thin film insertion was not performed on the bonding surface, a material other than silicon oxide was used as the substrate.

In all of the specific examples below, the substrates were bonded after performing treatments for both under the same steps as the bonding surface fabrication process of substrate E shown in FIG. 2. Therefore, the structure of the interface of the substrate assembly is the same structure as the above-described substrate assembly E. After bonding, the bonding strength of the substrate assembly was measured by a blade insertion method which is the same as the measurement of bonding strength in FIG. 4.

Example: Silicon—Silicon Nitride

The present example used, as one substrate, a silicon substrate on which a bonding surface was produced without undergoing thermal oxidation, and as the other substrate, a silicon substrate wherein silicon nitride was formed on the silicon substrate surface, and a bonding surface was formed Therefore, the present example essentially demonstrates the formation of a bonding surface, bonding, and measurement results for bonding strength between silicon and silicon nitride.

As indicated by NO2 in FIG. 10, the bonding strength of the present example was estimated at 2.5 J/m$^2$. In fact, when inserting a blade between the two substrates in a normal method of blade insertion, the substrates did not separate, and the silicon substrate was fractured, so the actual bonding strength of the present example was not measured. However, the fracture of the silicon substrate shows that a very strong bonding surface was formed. In other words, the bonding strength in the present example has at least the breaking strength of bulk silicon. In the drawings, the bonding strength at this time was estimated by the lowest limit value, so the breaking strength of bulk silicon, 2.5 J/m$^2$, was recorded.

The substrate assembly NO1 indicated at the far left of FIG. 10 is the same as the substrate assembly shown in FIG. 4, and is presented for the purposes of comparison.

Based on the measurements and estimates of the bonding strength, the strength of the substrate assembly NO2 in the present example was found to be greater than that of substrate assembly E (NO1 in FIG. 10), and at least as much as the bonding strength of a silicon substrate assembly.

Example: Silicon Oxide—Silicon Nitride

The present example used, as one substrate, a silicon substrate wherein the silicon substrate surface was thermally oxidized, then a bonding surface was formed, and as the other substrate, a silicon substrate wherein a silicon nitride was formed on the silicon substrate surface, then a bonding surface was formed. Therefore, the present example essentially demonstrates the formation of a bonding surface, bonding, and measurement results for bonding strength between silicon oxide and silicon nitride.

As indicated by N03 in FIG. 10, the bonding strength of the present example was estimated at 2.5 J/m$^2$. As with N02, the substrates did not separate during blade insertion, as a result of which the silicon substrate was fractured, so the estimate was recorded as 2.5 J/m$^2$ which is the bonding interface strength of silicon materials.

Based on the measurements and estimates of the bonding strength, the strength of the substrate assembly N03 in the present example was found to be greater than that of substrate assembly E (N01 in FIG. 10), and at least as much as the bonding strength of a silicon substrate assembly.

Example: Silicon Nitride—Silicon Nitride

In the present example, silicon substrates were used for both substrates, on each of which silicon nitride was formed on the silicon substrate surface, then a bonding surface was produced. Therefore, the present example essentially demonstrates the formation of a bonding surface, bonding, and measurement results for bonding strength between silicon nitride and silicon nitride.

As indicated by N04 in FIG. 10, the bonding strength of the present example was measured as 2.25 J/m². The silicon substrate was not fractured during blade insertion. This is a bonding strength of about 90% of the breaking strength of bulk silicon (2.5 J/m²).

Based on these measurements of the bonding strength, the strength of the substrate assembly N04 in the present example was found to be higher than that of substrate assembly E (N01 of FIG. 10).

As shown in FIG. 10, the measurement results for bonding strength of substrate assemblies N02, N03 and N04 in the above examples were all higher than that of substrate assembly N01. This shows that the method of the present invention is capable of obtaining a high bonding strength independent of the type of substrate.

<Relationship Between Degree of Vacuum when Bonding and Bonding Strength>

In all of the above examples, the substrates were bonded in a vacuum after performing the bonding surface fabrication processes of the present invention. In the following example, the substrates were bonded at atmospheric pressure after producing bonding surfaces in the same manner as the above-described example for silicon nitride-silicon nitride (N04 in FIG. 10).

The bonding strength of the substrate assembly N05 produced by bonding at atmospheric pressure was 0.9 J/m² as shown at the far right of FIG. 10. This is a bonding strength of about 35% with respect to the breaking strength of bulk silicon (2.5 J/m²). As shown in FIG. 10, the bonding strength of substrate assembly N05 was lower than the bonding strength of substrate assembly N04, but higher than the bonding strengths of substrate assemblies A and B shown in FIG. 4. Therefore, as a result of these bonding strength measurements, it was found that a sufficiently high bonding strength can be obtained by using the method of the present invention, even if the pressure at bonding is atmospheric pressure. Furthermore, one would naturally expect that the bonding strength when the pressure at bonding was lower than atmospheric pressure to be even greater than that of bonding assembly N05.

<Structure of the Apparatus>

At the beginning of the detailed description, an example of an apparatus structure for performing surface treatments and bonding surface fabrication, and bonding substrates together was described. Herebelow, examples of other apparatus structures will be explained.

An example of an apparatus structure is shown in FIG. 15(A). In the present example, a pair of substrates H06a, H06b is arranged so that their bonding surfaces face each other inside a process chamber H02 that can be set to a vacuum atmosphere. The energetic particle source H03 radiates energetic particles H05 in a horizontal direction towards the surfaces of the substrates H06a, H06b and the space between the substrate bonding surfaces, thereby simultaneously surface-treating the bonding surfaces of the substrates H06a, H06b. In the present example, a bonding mechanism H13 is further provided, enabling the surface-treated substrates to be brought into contact and bonded together. Since surface treatments can be performed on a pair of substrates with a single energetic particle source H03 and the distance between substrates is small, the apparatus structure is simple and economical. Additionally, the substrates can be bonded immediately after the surface treatment, reducing the chances of impurities adhering again after the surface treatment.

The apparatus structure for another example is shown in FIG. 15(B). In the apparatus structure shown in FIG. 15(A), the substrate surface is roughly parallel to the direction of the energetic particles H05, so there is a large difference in the intensity distribution of energetic particles on the substrate surface, and the energetic particle irradiation of the substrate surface cannot be considered to be uniform. Additionally, since the distance between substrates is small, there is a problem of impurities removed from one substrate surface adhering to the other substrate surface. Therefore, in the apparatus structure shown in FIG. 15(B), an energetic particle source H03 is provided for each substrate H06a, H06b, and the distance between the substrates is widened so that the energetic particles H05 irradiate the substrate from a higher angle. As a result, with the apparatus structure of the present example, the intensity distribution difference at the substrate surface of the energetic particles is smaller than in the above example. Furthermore, a bonding mechanism H13 may be provided to bring the substrates into contact and bond them together immediately after the surface treatment.

Another example of an apparatus structure is shown in FIG. 15(C). A single energetic particle source H03 is positioned facing the surface of the substrate H06 inside the process chamber H02. This energetic particle source H03 is capable of achieving a better intensity distribution of energetic particles than in the above examples by radiating energetic particles H03 roughly perpendicularly with respect to the surface of the substrate H06. As the bonding mechanism, a bonding chamber H14 is coupled to the process chamber H02 without breaking the vacuum, and each time the surface treatment of a substrate is completed in the process chamber H02, it is conveyed to the bonding chamber H14, where substrates H06 can be brought into contact and bonded using a bonding mechanism H13. Since this is a single-wafer process, more time is required from the treatment to bonding than for the above examples.

Another example of an apparatus structure is shown in FIG. 16(D). Inside the process chamber H02, the substrates H06a, H06b are arranged with their bonding surfaces facing each other. A mobile linear energetic particle source H03 is provided between the substrates. For example, as shown in FIG. 15(A), energetic particles are radiated not from a single point, but from a linear radiation source, making it suitable for performing surface treatments of wide substrates. In FIG. 16(D), the linear particle source is assumed to be in the form of a line that is long in the direction perpendicular to the paper surface. The energetic particle source H03 can be moved in the direction indicated by the single-dotted chain line, to scan the substrates H06a, H06b with energetic particles H05. When the energetic particle source H03 arrives at the end of one substrate H06a, the linear beam source H03 is inverted to scan energetic particles across another substrate H06b. According to the structure of this example, a surface treatment with a uniform energetic particle intensity can be performed, thereby also making the thickness of the bonding surface layer uniform. Furthermore, a bonding mechanism H13 may be provided to enable the substrates to be brought into contact and bonded immediately after the surface treatment.

Another example of an apparatus structure is shown in FIG. 6(E). Like the apparatus structure of FIG. 6(D), substrates H06a, H06b are arranged inside the process chamber H02 so that their bonding surfaces face each other. Furthermore, a mobile linear energetic particle source H03 is provided between the substrates. However, in the apparatus structure of FIG. 16(D), a mechanism for inverting the linear beam source H03 is needed. The apparatus structure of the present example does not use such an inverting mechanism, but instead uses a pair of particle sources. In other words, a pair of energetic particle sources H03c, H03d is provided, and each particle source irradiates respective substrates with energetic particles H05c, H05d. The energetic particle sources H03c, H03d may be moved in the direction indicated by the single-dotted chain line to scan the substrates H06a, H06b with energetic particles H05c, H05d. As with the previous example, due to the structure of the present example, a surface treatment with uniform energetic particle intensity can be performed, thereby also making the thickness of the bonding surface layer uniform. Furthermore, a bonding mechanism H13 may be provided to enable the substrates to be brought into contact and bonded immediately after the surface treatment. Additionally, the upper and lower substrates can be simultaneously processed, reducing the exposure time from surface treatment to bonding compared with the apparatus structure of FIG. 16(D).

Another example of the apparatus structure is shown in FIG. 17(F). A linear energetic particle source H03 is immobilized inside the process chamber H02, and the substrate H06 is moved to the right in the drawing, thereby scanning the energetic particles H05 across the substrate H06. Surface treatments can further be performed by similarly moving other substrates H06 to the right in the drawing. One of the pair of substrates can be inverted so that the bonding surfaces of the substrates face each other, and they can be brought into contact and bonded by means of the bonding mechanism H13. Additionally, surface treatments can be performed during handling, using means for conveying the wafers to the bonding chamber, for example, a robot, making the process more efficient and simplifying the apparatus.

Another example of an apparatus structure is shown in FIG. 17(G). Inside the process chamber H02, a pair of substrates H06a, H06b is arranged in parallel with the surfaces to be surface-treated on the outside. The energetic particle sources H03c, H03d are arranged to face the substrates H06a, H06b from the outside of the pair of substrates, and are immobilized with respect to the process chamber H02. Due to the substrates H06a, H06b moving to the right in the drawing, the substrate H06 is scanned by energetic particles H05 to perform the surface treatment. The present example does not require a mechanism for inverting the substrates. The substrates whose surface treatments have been completed are bonded using a bonding mechanism H13 inside a bonding chamber H14.

FIG. 26 is a vertical section view of a bonding apparatus 1 (also referred to as 1A) according to a first embodiment of the present invention. In the drawings, the direction is indicated using an orthogonal XYZ coordinate system for the sake of convenience.

This bonding apparatus 1 is an apparatus that activates a bonding surface of an object to be bonded 91 and a bonding surface of an object to be bonded 92 with an atomic beam or the like inside a chamber (vacuum chamber) 2 under reduced pressure, to bond together the objects to be bonded 91, 92. According to this apparatus 1, a surface activation treatment can be performed on the bonding surfaces of both the objects to be bonded 91, 92, while also enabling solid-state bonding of the objects to be bonded 91, 92. Various materials (e.g., semiconductor wafers, etc.) can be used as the objects to be bonded 91, 92.

The bonding apparatus 1 includes a vacuum chamber 2 which is a processing space for the objects to be bonded 91, 92, and a load-lock chamber 3 coupled to the vacuum chamber 2. The vacuum chamber 2 is connected to the vacuum pump 5 via an exhaust pipe 6 and an exhaust valve 7. By reducing (depressurizing) the pressure inside the vacuum chamber 2 with an evacuation operation by the vacuum pump 5, the vacuum chamber 2 is put into a vacuum state. Additionally, the exhaust valve 7 is capable of adjusting the degree of vacuum inside the vacuum chamber 2 by means of an opening/closing action and adjustment of the exhaust flow rate.

After the objects to be bonded 91, 92 are held by a clamping chuck 4c at the tip portion of a feed pipe 4 inside the load-lock chamber 3, they are moved inside the vacuum chamber 2. Specifically, the upper object to be bonded 92 is held by the tip portion of a feeding rod 4, then moved in the X direction to a position PG2 directly under the head 22, then picked up by the head 22. Similarly, the lower object to be bonded 91 is held at the tip portion of the feeding rod 4 and moved toward stage 12 in the X direction to position PG1, then held by the stage 12.

The head 22 and the stage 12 are both provided inside the vacuum chamber 2.

The head 22 is moved (translated) in the X direction and the Y direction by an alignment table 23, and rotated in the θ direction (direction of rotation about the Z axis) by a rotary drive mechanism 25. The head 22 is driven by the alignment table 23 and the rotary drive mechanism 25 based on the positional detection results or the like from a position recognition portion 28 to be described below, to perform alignment in the X direction, Y direction and θ direction.

Additionally, the head 22 is moved (elevated) in the Z direction by a Z axis lift drive mechanism 26. The Z axis lift drive mechanism 26 is capable of controlling the applied pressure at the time of bonding based on signals detected by a pressure detecting sensor which is not shown.

Additionally, the stage 12 can be moved (translated) in the X0 direction by a slide movement mechanism 14. The stage 12 is moved in the X direction between a standby position near the beam irradiation portion 11 (around position PG1) and a bonding position immediately below the head 22 (around position PG2). The slide movement mechanism 14 has a high-precision position detector (linear scale), whereby the stage 12 can be positioned with high precision.

Additionally, the bonding apparatus 1 includes position recognition portions 18, 28 for recognizing the positions of the objects to be bonded 91, 92. The position recognition portions 18, 28 respectively have imaging portions (cameras) 18b, 28b for acquiring light images of the objects to be bonded as image data. Additionally, the objects to be bonded 91, 92 are respectively provided with position recognition marks (hereafter referred to simply as marks). For example, two position recognition marks may be provided on one object to be bonded 91, and two position recognition marks may be provided on the other object to be bonded 92. These marks preferably have a specific shape. However, the invention is not so limited, and an orientation flat of a wafer or a part of the circuit pattern formed on a wafer may serve as an alternative to the position recognition mark.

The positioning actions of the objects to be bonded 91, 92 are performed by the position recognition portions (cameras etc.) recognizing the positions of marks appended to the objects to be bonded 91, 92.

For example, the position recognition portion 18 acquires a light image of an object to be bonded 91 present at position PG1 as image data. Specifically, light emitted from a light source 18a positioned outside and above the vacuum chamber 2 passes through a window portion 2a of the vacuum chamber 2 and reaches the object to be bonded (position PG1) where it is reflected. Additionally, the light reflected by the object to be bonded 91 propagates again through the window portion 2a of the vacuum chamber 2 and reaches the imaging portion 18b. In this way, the position recognition portion 18 acquires a light image of the object to be bonded 91 as image data. Then, the position recognition portion 18 extracts the marks from the image data, recognizes the positions of the marks, and thereby recognizes the position of the object to be bonded 91.

Similarly, the position recognition portion 28 acquires a light image of an object to be bonded 92 present at position PG2 as image data. Specifically, light emitted from light source 28a positioned outside and below the vacuum chamber 2 passes through a window portion 2b of the vacuum chamber 2 and reaches the object to be bonded 92 (position PG2) where it is reflected. Additionally, the light reflected by the object to be bonded 92 (specifically a portion thereof) propagates again through the window portion 2b of the vacuum chamber 2 and reaches the imaging portion 28b. In this way, the position recognition portion 28 acquires a light image of the object to be bonded 92 as image data. Additionally, the position recognition portion 28 extracts marks based on this image data, recognizes the positions of these marks, and thereby recognizes the position of the object to be bonded 92.

Furthermore, as will be described below, in this bonding apparatus 1, the stage 12 moves in the X direction, causing the object to be bonded 91 to move to position PG2, transitioning to a state in which the objects to be bonded 91, 92 face each other. As shown in FIG. 28, the position recognition portion 28 can acquire light images of the objects to be bonded 91, 92 as image data with the objects to be bonded 91, 92 facing each other. Specifically, the light emitted from the light source 28a positioned outside and below the vacuum chamber 2 passes through the window portion 2b of the vacuum chamber 2 and is reflected by the objects to be bonded 91, 92 (specifically a portion thereof), then propagates again through the window portion 2b of the vacuum chamber 2 and reaches the imaging portion 28b. The position recognition portion 28 acquires light images (images of the reflected light) of the objects to be bonded 91, 92 obtained in this way, and recognizes the positions of the marks based on the image data. As the light source 28a, light (such as infrared light) that is transmitted by both objects to be bonded 91, 92 and the stage 12 may be used.

Additionally, in this embodiment, as shown in FIG. 28, the position recognition portion 28 also has other light sources 28c, 28d. The position recognition portion 28 is capable of recognizing the positions of both objects to be bonded 91, 92 using image data of transmitted light from the light sources 28c, 28d with both objects to be bonded 91, 92 facing each other. Specifically, the light emitted from the light sources 28c, 28d positioned outside and to the side of the vacuum chamber 2 passes through the window portions 2c, 2d of the vacuum chamber 2, then is reflected by mirrors 28e, 28f which change the direction of propagation, and propagates downward. After further passing through the objects to be bonded 91, 92 (specifically a portion thereof), the light passes through the window portion 2b and reaches the imaging portion 28b. The position recognition portion 28 acquires light images (images of transmitted light) of both objects to be bonded 91, 92 obtained in this way as image data and recognizes the positions of the marks based on the image data.

Thus, the bonding apparatus 1 is equipped with two types of imaging systems, these being an imaging system using reflected light (including light source 28a and an imaging portion 28b) and an imaging system using transmitted light (including light sources 28c, 28d and an imaging portion 28b). The bonding apparatus 1 is capable of recognizing the positions of the marks by appropriately switching between and using these two types of imaging systems as conditions require.

The positions of the objects to be bonded 91, 92 are recognized by the position recognition portions 18, 28 in the above manner. Additionally, based on the recognized position information, the head 22 is driven in the X direction, Y direction and/or θ direction by the alignment table 23 and the rotary drive mechanism 25 to move relative to the objects to be bonded 91, 92 in carrying out the alignment action. For example, by moving the objects to be bonded 91, 92 microscopically so that the two marks provided on object to be bonded 91 and the two marks provided on object to be bonded 92 overlap, the objects to be bonded 91, 92 can be finely positioned.

Additionally, the bonding apparatus 1 includes three beam emitting portions 11, 21, 31. In the bonding apparatus 1, the surface activation process is performed using these three beam emitting portions 11, 21, 31. As shown in FIG. 26, the beam emitting portions 11 and 21 are provided on a side wall surface at the far end (+Y side) of the vacuum chamber 2, and the beam emitting portion 31 is provided on a side wall surface at the right side (+X side) of the vacuum chamber 2. The beam emitting portions 11, 21 and 31 respectively emit beams of specific substances toward corresponding positions inside the vacuum chamber 2.

More specifically, as shown in FIG. 26, the beam emitting portion 11 is provided near position PG1 relatively to the left side (−X side) inside the vacuum chamber, and the beam emitting portion 21 is positioned near position PG2 relatively to the right side (+X side) inside the vacuum chamber 2.

As shown also by the section view of FIG. 27, the beam emitting portion 31 is arranged parallel to the horizontal plane on the +X side wall surface of the vacuum chamber 2. As a result, with the object to be bonded 91 held on the stage 12 and the object to be bonded 92 held by the head 22 facing each other at position PG2, the beam emitting portion 31 emits a beam from the side of the space SP across which the objects 91, 92 oppose each other and toward the opposition space SP. The beam emitting direction of the beam emitting portion 31 is a direction parallel to the X axis.

In this bonding apparatus 1, by emitting specific substances (such as argon) from the beam emitting portions 11, 21 in a slide arrangement state to be described below, a surface activation process for activating the bonding surfaces of the objects to be bonded 91, 92 is performed. Additionally, the bonding apparatus 1 brings the objects to be bonded 91, 92 which have been subjected to a surface activation treatment into a proximate opposed state, then brings them together to bond the objects to be bonded 91, 92.

Additionally, in this embodiment, the beam emitting portion 31 further emits specific substances (such as argon) after the objects to be bonded 91, 92 have been put into a proximate opposed state, thereby also carrying out a surface activation treatment for activating the bonding surfaces of the objects to be bonded 91, 92.

Here, the beam emitting portions 11, 21, 31 activate the bonding surfaces of the objects to be bonded 91, 92 by accelerating the ionized specific substance (argon in this case) with an electric field and emitting the specific substances toward the bonding surfaces of the objects to be bonded 91, 92. In other words, the beam emitting portions 11, 21 and 31 activate the bonding surfaces of the objects to be bonded 91, 92 by emitting energy waves. Additionally, the pair of beam emitting portions 11, 21 and 31 may be separated by particle beam and metal beam. For example, the beam emitting portions 11, 21 may emit a neutral atomic beam (fast atom beam, or FAB) not containing metal particles, and the beam emitting portion 31 may emit an ion beam such as shown in FIG. 29 containing large quantities of metal particles. Additionally, the beam emitting portions 11, 21 may emit ion beams as shown in FIG. 29, in which the amount of metal particles contained therein may be adjusted as compared with the beam emitting portion 31.

As shown in FIG. 29, a beam emitting portion 31D includes an anode 51, a cathode 52 and a magnet 54. The anode 51 and the cathode 52 are electrodes (also called electrode members or metal members) composed of respectively appropriate metal materials. For example, the anode 51 is composed of iron (Fe), and the cathode 52 is composed of tungsten (W). Additionally, the anode 51 is horn-shaped (roughly conical), while the cathode 52 is filament-shaped (coil-shaped). Additionally, the main body portion 59 of the beam emitting portion 31D is roughly cylindrical, and has a concave portion 58 in a front central portion. This concave portion 58 is formed as a space surrounded by the horn-shaped (megaphone-shaped) anode 51. The anode 51 and the cathode 52 are electrically insulated from each other, the anode 51 having an anode potential and the cathode 52 having a cathode potential.

In the vicinity of the emission port of the beam emitting portion 31D, electrons supplied from the cathode 52 are trapped by the magnetic field of the magnet 54, and begin circling in the vicinity of the emission port (see the circular dashed line in FIG. 29). Additionally, further supplied argon is acted upon by the electrons and is present in a plasma state. Then, argon ions in a plasma state are accelerated by an electric field E generated by a voltage applied between the electrodes 51, 52 (particularly due to the repulsive force of the anode 51), and move toward the cathode 52, going past the position of the cathode 52 and being cast outside the beam emitting portion 31D. At this time, the argon ions collide with the anode 51 and the cathode 52, sputtering parts of the anode 51 and the cathode 52. Additionally, the sputtered metal atoms move toward the bonding surfaces of the objects to be bonded 91, 92, where they adsorb to and are deposited on the bonding surfaces.

In the above embodiments, the beam emitting portion 31D was exemplified by one having a relatively compact anode 51, but the beam emitting portion 31D may be replaced by a beam emitting portion 31E as shown in FIG. 30. In this beam emitting portion 31E, a roughly conical anode 51 is elongated in the direction of the cathode 52. More specifically, the beam emitting portion 31E includes an anode 51 (51E) that extends from the end (front end) 59f of the aperture side of the main body portion 59 to a forward (−X side) position. In other words, the anode 51E has a guide portion 51g protruding forward from the front end surface 59f of the main body portion 59 of the emitting portion 31E near the emission port of the beam emitting portion 31E.

For this reason, the anode 51E of the beam emitting portion 31E is capable of raising the directionality of the scattering range (irradiation range) of argon and metals compared to the anode 51 (51D) of the beam emitting portion 31D. This prevents argon and metals from scattering to unwanted parts (portions of the objects to be bonded 91, 92 apart from the bonding surfaces). Additionally, by using an anode 51E having a guide portion 51g, the area of collision between the argon ions and the anode can be increased, so that a relatively large amount of metal can be removed, and the relatively large amount of metal moved in the direction of the bonding surface. As a result, with the beam emitting portion 31E, a larger amount of metal atoms than the beam emitting portion 31D can be efficiently supplied toward the objects to be bonded 91, 92. In view thereof, it is preferable to use the beam emitting portion 31E rather than beam emitting portion 31D. Additionally, the cathode 52 may be provided with an electron emitter (hollow cathode) separate from the beam emitting portion. The electrons emitted from the cathode also function to make the irradiated surface ionically neutral.

Additionally, as shown in FIG. 31, the present example achieved a relatively high bonding strength when the acceleration voltage of the energetic particles was 36 or 94 V, while bonding was not possible at 30 V (bonding strength=0 J/m$^2$).

Several causes may be considered for the reason why the bonding strength falls so much that bonding is not possible at a certain threshold value. One cause may be that, due to the irradiation conditions, the removal of impurities may not be sufficient and the amorphization may also be insufficient, as a result of which the bonding strength between the iron and the substrate may be insufficient, or the iron atoms contained in the surface layer may be susceptible to oxidation, as a result of which the iron atoms may oxidize before bonding and reduce the bonding strength.

Additionally, FIG. 32 shows the results of measurement of the iron $2p$ spectrum on the surface of a substrate obtained by re-separating bonded substrates, as in the case of the bonding strength measurement. The substrate surface after the surface treatment is protected from oxidation and re-adsorption of impurities, thereby mostly retaining the condition after surface treatment. Therefore, the state of the substrate surface after surface treatment can be known by studying the state of the substrate surface after separation of the bonded substrates. FIG. 32 shows the iron $2p$ spectrum on the substrate surface after separation of a substrate assembly when holding the particle source drive conditions the same but changing two other conditions (C1, C2). The condition C1 indicates the conditions for providing a high bonding strength and the condition C2 indicates the conditions for providing a relatively low bonding strength. When observing the spectral components corresponding to FeO and $Fe_2O_3$, it can be observed that the iron on the substrate surface when applying a surface treatment (C2) providing a relatively low bonding strength is oxidized compared to a surface treatment (C1) providing a high bonding strength. Therefore, one cause of the decrease in bonding strength can be considered to be the fact that the iron of the substrate surface layer is oxidized before bonding.

Additionally, in the embodiments of the present invention, the bonding process is preferably performed at room temperature, but the bonding substrates can also be heated. As long as the temperature is kept low at about 200° C. or less, there are considerable merits compared to conventional thermal bonding. Additionally, the temperature should more preferably be equal to or less than 183° C. which is the melting point of conventional solder.

While this completes the description of the embodiments, various modifications are easily possible without departing from the spirit of the present invention.

Herebelow, some embodiments will be presented in appendix form.

(Appendix 1)
A bonding substrate fabrication method for fabricating a substrate ("bonding substrate") on which a bonding surface is formed, the bonding substrate fabrication method comprising:
 a surface treatment step of surface-treating a surface of a substrate by irradiation with radiated particles including energetic particles; and
 a step of forming a silicon thin film on the surface-treated substrate surface to fabricate the bonding substrate.

(Appendix 2)
The bonding substrate fabrication method according to appendix 1, further comprising a second surface treatment step of surface-treating the formed silicon thin film by irradiation with radiated particles including metal particles to fabricate the bonding substrate.

(Appendix 3)
The bonding substrate fabrication method according to appendix 1 or 2, wherein the surface treatment step includes a process of irradiating the substrate surface with radiated particles including metal particles.

(Appendix 3C)
The bonding substrate fabrication method according to appendix 3, wherein a rotary sputtering target comprising a silicon target surface and a metal particle target surface is used, silicon on the silicon target surface is sputtered by radiated particles to form a silicon thin film on the substrate surface, and metal particles on the metal particle target surface are sputtered by radiated particles to irradiate the substrate surface with metal particles.

(Appendix d3)
The bonding substrate fabrication method according to appendix 3, wherein during the surface treatment step, the process of irradiating the substrate surface with radiated particles including energetic particles and the process of irradiating the substrate surface with radiated particles including metal particles are implemented simultaneously.

(Appendix d4)
The bonding substrate fabrication method according to appendix 3, wherein during the surface treatment step, after the process of irradiating the substrate surface with radiated particles including energetic particles, the process of irradiating the substrate surface with radiated particles including metal particles is implemented.

(Appendix d5)
The bonding substrate fabrication method according to appendix 3, wherein during the surface treatment step, after the process of irradiating the substrate surface with radiated particles including energetic particles, the process of irradiating the substrate surface with radiated particles including metal particles is implemented at the same time as the process of irradiating the substrate surface with radiated particles including the energetic particles.

(Appendix d6)
The bonding substrate fabrication method according to any one of appendices 1 to d5, further comprising a second surface treatment step of surface-treating the surface of the formed silicon thin film by irradiation with radiated particles including energetic particles to fabricate the bonding substrate.

(Appendix d7)
The bonding substrate fabrication method according to appendix 2, wherein the second surface treatment step includes a process of irradiating the silicon thin film surface with radiated particles including metal particles.

(Appendix d8)
The bonding substrate fabrication method according to appendix d7, wherein during the second surface treatment step, the process of irradiating the silicon thin film surface with radiated particles including energetic particles and the process of irradiating the silicon thin film surface with radiated particles including metal particles are implemented simultaneously.

(Appendix d9)
The bonding substrate fabrication method according to appendix d7, wherein during the surface treatment step, after the process of irradiating the silicon thin film surface with radiated particles including energetic particles, the process of irradiating the silicon thin film surface with radiated particles including metal particles is implemented.

(Appendix d10)
The bonding substrate fabrication method according to appendix d7, wherein during the surface treatment step, after the process of irradiating the silicon thin film surface with radiated particles including energetic particles, the process of irradiating the silicon thin film surface with radiated particles including metal particles is implemented at the same time as the process of irradiating the silicon thin film surface with radiated particles including the energetic particles.

(Appendix 4)
The bonding substrate fabrication method according to appendix 3, wherein the metal particles are of a transition metal.

(Appendix 5)
The bonding substrate fabrication method according to appendix 4, wherein the transition metal is iron.

(Appendix d14)
The bonding substrate fabrication method according to appendix 3 or d7, wherein the energetic particles are inert gas ions and/or neutral atoms, and the metal particles are metal ions, metal neutral atoms and/or clusters.

(Appendix d15)
The bonding substrate fabrication method according to appendix d6, wherein when the second surface treatment step includes a process of irradiating the surface of the silicon thin film with radiated particles including energetic particles and a process of irradiating the surface of the silicon thin film with radiated particles including metal particles,
 the surface layer of the bonding substrate has silicon as a main component, does not form a metal layer, and has a metal concentration wherein the metals are dispersed in the depth direction.

(Appendix d16)
The bonding substrate fabrication method according to any one of appendices 1 to d15, wherein the formation of the silicon film is implemented by sputter deposition, CVD or PVD.

(Appendix d17)
The bonding substrate fabrication method according to appendix 1, wherein the radiated particles including energetic particles are radiated particles substantially consisting only of the energetic particles.

(Appendix d18)
The bonding substrate fabrication method according to appendix 3, wherein the radiated particles including metal particles are radiated particles substantially consisting only of metal particles.

(Appendix 6)
A substrate bonding method comprising:
preparing bonding substrates fabricated by the method according to any one of appendices 1 to 5; and
bonding the bonding substrates together.

(Appendix 7)
A substrate bonding method comprising:
preparing a bonding substrate fabricated by the method according to any one of appendices 1 to 5;
preparing a substrate ("M substrate") to be bonded to the bonding substrate; and
bonding the bonding substrate to the M substrate.

(Appendix 8)
A bonding substrate according to appendix 5 or 6, wherein a main material of the substrate is silicon, silicon oxide, silicon nitride, sapphire, aluminum oxide, a ceramic material, a dielectric material, a ferroelectric material, or a polymer material.

(Appendix 9)
A substrate bonding method for bonding substrates, comprising:
forming a bonding surface on at least one substrate of a pair of substrates to be bonded by the method according to appendices 1 to 5, and
bonding the substrates together in a vacuum of at least $10^{-5}$ Pa or in air.

(Appendix 10)
A bonding substrate fabrication apparatus for fabricating a substrate ("bonding substrate") on which a bonding surface is formed, the bonding substrate fabrication apparatus comprising:
a process chamber;
an energetic particle source disposed inside the process chamber, for surface-treating a surface of the substrate by irradiation with radiated particles including energetic particles; and
a silicon source disposed inside the process chamber, for forming a silicon thin film on the surface-treated substrate surface.

(Appendix 11)
The bonding substrate fabrication apparatus according to appendix 10, further comprising a metal particle source disposed inside the process chamber, for surface-treating the surface of the substrate by irradiation with radiated particles including metal particles.

(Appendix 11C)
The bonding substrate fabrication apparatus according to appendix 11, wherein the silicon source and the metal particle source comprise a sputtering target sputtered by radiated particles form the energetic particle source, the sputtering target being in the shape of a polygonal prism having multiple surfaces and capable of rotating, at least one surface being provided with a silicon target and at least one other surface beign provided with a metal particle target.

(Appendix 12)
The bonding substrate fabrication apparatus according to appendix 11, wherein the metal particle source comprises a metal body.

(Appendix d24)
The bonding substrate fabrication apparatus according to appendix 12, wherein the metal body is conical.

(Appendix d25)
The bonding substrate fabrication apparatus according to appendix 12, wherein the metal body is grid-shaped.

(Appendix 13)
The bonding substrate fabrication apparatus according to appendix 12, wherein the metal body generates metal radiated particles by sputtering due to radiated particles from the energetic particle source.

(Appendix 14)
The bonding substrate fabrication apparatus according to appendix 12 or 13, wherein the metal body is movably arranged.

(Appendix d28)
The bonding substrate fabrication apparatus according to appendix 14, wherein metal particle radiation from the metal body to the substrate surface is suppressed when the metal body is in a retracted position.

(Appendix 15)
The bonding substrate fabrication apparatus according to any one of appendices 10 to 14, wherein the silicon source is a CVD apparatus for forming the silicon thin film.

(Appendix 16)
The bonding substrate fabrication apparatus according to any one of appendices 10 to 14, wherein the silicon source is a PVD apparatus for forming the silicon thin film.

(Appendix 17)
The bonding substrate fabrication apparatus according to any one of appendices 10 to 16, wherein the energy particle source comprises a linear ion source.

(Appendix 18)
A bonding substrate fabrication apparatus for fabricating a substrate ("bonding substrate") on which a bonding surface is formed, the bonding substrate fabrication apparatus comprising:
an energetic particle source for radiating radiated particles including energetic particles;
a silicon source; and
an orientation control device for controlling an orientation of the energetic particle source;
wherein the orientation control device,
in a surface treatment mode, arranges the energetic particle source in a first orientation to direct radiated particles from the energetic particle source to the substrate surface; and
in a silicon thin film forming mode wherein a silicon thin film is formed on the substrate surface, arranges the energetic particle source in a second orientation to direct radiated particles from the energetic particle source to the silicon source; and
wherein the silicon source, in the silicon thin film forming mode, is arranged in an orientation for radiating silicon particles toward the substrate surface in response to radiated particles from the energetic particle source.

(Appendix 19)
The bonding substrate fabrication apparatus according to appendix 18, wherein the orientation control apparatus comprises a mechanical component for rotatably supporting the energetic particle source.

(Appendix 20)
The bonding substrate fabrication apparatus according to appendix 18 or 19, further comprising a metal particle source for surface-treating the surface of the substrate by irradiation of radiated particles including metal particles.

(Appendix 21)
The bonding substrate fabrication apparatus according to appendix 20, wherein the metal particle source comprises a metal body.

(Appendix d36)
The bonding substrate fabrication apparatus according to any one of appendices 18 to 20, comprising a carrier for movably supporting the substrate.
(Appendix 22)
A substrate assembly comprising:
a pair of substrates that are bonded to each other; and
an interface layer having silicon as a main component formed between the pair of substrates;
the substrate assembly including a metal between the interface layer and at least one substrate of the pair of substrates;
wherein the bonding strength between the substrates is at least 0.5 J/m$^2$.
(Appendix d37)
The substrate assembly according to appendix 22, wherein the bonding strength between the substrates is at least 1.0 J/m$^2$.
(Appendix 23)
The substrate assembly according to appendix 22, wherein a metal is included between the interface layer and each of the pair of substrates.
(Appendix 24)
The substrate assembly according to appendix 22 or 23, wherein the interface layer comprises a metal in a central portion.
(Appendix d38)
The substrate assembly according to appendix 22, wherein the bonding strength between the substrates is at least 1.0 J/m$^2$.
(Appendix 25)
The substrate assembly according to any one of appendices 22 to 24, wherein each metal is a transition metal.
(Appendix 26)
The substrate assembly according to appendix 25, wherein the transition metal is iron.
(Appendix 27)
The substrate assembly according to any one of appendices 22 to 26, wherein a metal layer is not formed in the interface layer, and a metal concentration is dispersed.
(Appendix d3)
The bonding substrate fabrication method according to appendix 2, wherein during the surface treatment step, the process of irradiating the substrate surface with radiated particles including energetic particles and the process of irradiating the substrate surface with radiated particles including metal particles are implemented simultaneously.
(Appendix d4)
The bonding substrate fabrication method according to appendix 2, wherein during the surface treatment step, after the process of irradiating the substrate surface with radiated particles including energetic particles, the process of irradiating the substrate surface with radiated particles including metal particles is implemented.
(Appendix d5)
The bonding substrate fabrication method according to appendix 2, wherein during the surface treatment step, after the process of irradiating the substrate surface with radiated particles including energetic particles, the process of irradiating the substrate surface with radiated particles including metal particles is implemented at the same time as the process of irradiating the substrate surface with radiated particles including the energetic particles.
(Appendix d6)
The bonding substrate fabrication method according to any one of appendices 1 to 5, further comprising a second surface treatment step of surface-treating the surface of the formed silicon thin film by irradiation with radiated particles including energetic particles to fabricate the bonding substrate.
(Appendix d7)
The bonding substrate fabrication method according to appendix 6, wherein the second surface treatment step includes a process of irradiating the silicon thin film surface with radiated particles including metal particles.
(Appendix d8)
The bonding substrate fabrication method according to appendix 7, wherein during the second surface treatment step, the process of irradiating the silicon thin film surface with radiated particles including energetic particles and the process of irradiating the silicon thin film surface with radiated particles including metal particles are implemented simultaneously.
(Appendix d9)
The bonding substrate fabrication method according to appendix 7, wherein during the surface treatment step, after the process of irradiating the silicon thin film surface with radiated particles including energetic particles, the process of irradiating the silicon thin film surface with radiated particles including metal particles is implemented.
(Appendix d10)
The bonding substrate fabrication method according to appendix 7, wherein during the surface treatment step, after the process of irradiating the silicon thin film surface with radiated particles including energetic particles, the process of irradiating the silicon thin film surface with radiated particles including metal particles is implemented at the same time as the process of irradiating the silicon thin film surface with radiated particles including the energetic particles.
(Appendix d14)
The bonding substrate fabrication method according to appendix 2 or 7, wherein the energetic particles are inert gas ions and/or neutral atoms, and the metal particles are metal ions, metal neutral atoms and/or clusters.
(Appendix d15)
The bonding substrate fabrication method according to appendix 6, wherein when the second surface treatment step includes a process of irradiating the surface of the silicon thin film with radiated particles including energetic particles and a process of irradiating the surface of the silicon thin film with radiated particles including metal particles,
the surface layer of the bonding substrate has silicon as a main component, does not form a metal layer, and has a metal concentration wherein the metals are dispersed in the depth direction.
(Appendix d16)
The bonding substrate fabrication method according to any one of appendices 1 to 15, wherein the formation of the silicon film is implemented by sputter deposition, CVD or PVD.
(Appendix d17)
The bonding substrate fabrication method according to appendix 1, wherein the radiated particles including energetic particles are radiated particles substantially consisting only of the energetic particles.
(Appendix d18)
The bonding substrate fabrication method according to appendix 2, wherein the radiated particles including metal particles are radiated particles substantially consisting only of metal particles.
(Appendix d24)
The bonding substrate fabrication apparatus according to appendix 12, wherein the metal body is conical.

(Appendix d25)

The bonding substrate fabrication apparatus according to appendix 12, wherein the metal body is grid-shaped.

(Appendix d28)

The bonding substrate fabrication apparatus according to appendix 27, wherein metal particle radiation from the metal body to the substrate surface is suppressed when the metal body is in a retracted position.

(Appendix d36)

The bonding substrate fabrication apparatus according to any one of appendices 18 to 20, comprising a carrier for movably supporting the substrate.

(Appendix d38)

The substrate assembly according to appendix 22, wherein the bonding strength between the substrates is at least 1.0 J/m$^2$.

(Appendix d41)

The substrate assembly according to appendix 22, wherein the bonding strength between the substrates is at least 1.5 J/m$^2$.

The invention claimed is:

1. A bonding substrate fabrication method for fabricating a substrate on which a bonding surface is formed, the bonding substrate fabrication method comprising:
   a surface treatment step of surface-treating a surface of a substrate by irradiation with radiated particles including energetic particles within a chamber; and
   a step of forming a silicon thin film on the surface-treated substrate surface to fabricate the bonding substrate by sputtering a silicon source within the chamber; and
   wherein the surface treatment step and the step of forming the silicon thin film are performed by using the same energetic particle source, and the energetic particle source is directed toward the substrate surface when the surface treatment step is performed, and the energetic particle source is directed toward the silicon source when the step of forming the silicon thin film is performed; and
   wherein the surface treatment step includes a process of irradiating the substrate surface with radiated particles including metal particles.

2. The bonding substrate fabrication method according to claim 1, further comprising a second surface treatment step of surface-treating the formed silicon thin film by irradiation with radiated particles including energetic particles to fabricate the bonding substrate.

3. The bonding substrate fabrication method according to claim 1, wherein the metal particles are of a transition metal.

4. The bonding substrate fabrication method according to claim 3, wherein the transition metal is iron.

5. A substrate bonding method comprising:
   preparing a pair of bonding substrates, at least one of the bonding substrates being fabricated by a method comprising:
      a surface treatment step of surface-treating a surface of a substrate by irradiation with radiated particles including energetic particles within a chamber; and
      a step of forming a silicon thin film on the surface-treated substrate surface to fabricate the bonding substrate by sputtering a silicon source within the chamber; and
   bonding the bonding substrates together; and
   wherein the surface treatment step and the step of forming the silicon thin film are performed by using the same energetic particle source, and the energetic particle source is directed toward the substrate surface when the surface treatment step is performed, and the energetic particle source is directed toward the silicon source when the step of forming the silicon thin film is performed; and
   wherein the surface treatment step includes a process of irradiating the substrate surface with radiated particles including metal particles.

6. A substrate bonding method according to claim 5, wherein a main material of the substrate is silicon, silicon oxide, silicon nitride, sapphire, aluminum oxide, a ceramic material, a dielectric material, a ferroelectric material, or a polymer material.

7. A substrate bonding method for bonding substrates, according to claim 5, wherein the substrates are bonded together in a vacuum of at least $10^{-5}$ Pa or in air.

8. A substrate bonding method comprising:
   preparing a pair of bonding substrates fabricated by a bonding substrate fabrication method comprising:
      a surface treatment step of surface-treating a surface of a substrate by irradiation with radiated particles including energetic particles within a chamber; and
      a step of forming a silicon thin film on the surface-treated substrate surface to fabricate the bonding substrate by sputtering a silicon source within a chamber; and
   bonding the bonding substrates together; and
   wherein the surface treatment step and the step of forming the silicon thin film are performed by using the same energetic particle source, and the energetic particle source is directed toward the substrate surface when the surface treatment step is performed, and the energetic particle source is directed toward the silicon source when the step of forming the silicon thin film is performed; and
   wherein the surface treatment step includes a process of irradiating the substrate surface with radiated particles including metal particles.

9. A substrate assembly comprising:
   a pair of substrates that are bonded to each other; and
   an interface layer having silicon as a main component formed between the pair of substrates;
   the substrate assembly including a metal between the interface layer and at least one substrate of the pair of substrates;
   wherein the bonding strength between the substrates is at least 0.5 J/m$^2$; and
   wherein a metal is included between the interface layer and each of the pair of substrates.

10. The substrate assembly according to claim 9, wherein the interface layer comprises a metal in a central portion.

11. The substrate assembly according to claim 9, wherein each metal is a transition metal.

12. The substrate assembly according to claim 11, wherein the transition metal is iron.

13. The substrate assembly according to claim 9, wherein a metal layer is not formed in the interface layer, and a metal concentration is dispersed.

* * * * *